US011143727B2

(12) United States Patent
Raynal et al.

(10) Patent No.: US 11,143,727 B2
(45) Date of Patent: Oct. 12, 2021

(54) MINIATURE STOCHASTIC NUCLEAR MAGNETIC RESONANCE

(71) Applicant: Massachusetts Institute of Technology, Cambridge, MA (US)

(72) Inventors: Ashley Brown Raynal, West Chester, PA (US); Ian W. Hunter, Lincoln, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 17/055,747

(22) PCT Filed: May 6, 2020

(86) PCT No.: PCT/US2020/031650
§ 371 (c)(1),
(2) Date: Nov. 16, 2020

(87) PCT Pub. No.: WO2020/227392
PCT Pub. Date: Nov. 12, 2020

(65) Prior Publication Data
US 2021/0231760 A1     Jul. 29, 2021

Related U.S. Application Data

(60) Provisional application No. 62/843,769, filed on May 6, 2019.

(51) Int. Cl.
*G01R 33/46* (2006.01)
*G01R 33/3875* (2006.01)
(Continued)

(52) U.S. Cl.
CPC ....... *G01R 33/4616* (2013.01); *G01N 24/082* (2013.01); *G01R 33/383* (2013.01); *G01R 33/3875* (2013.01)

(58) Field of Classification Search
CPC .............. G01R 33/4616; G01R 33/383; G01R 33/3875; G01N 24/082
See application file for complete search history.

(56) References Cited

U.S. PATENT DOCUMENTS

| 3,786,341 A | 1/1974 | Anderson et al. |
| 6,507,190 B1 * | 1/2003 | Hinks ................. G01R 33/389 324/307 |

(Continued)

FOREIGN PATENT DOCUMENTS

| CN | 103163177 B | 9/2015 |
| WO | 2012174148 A2 | 12/2012 |

OTHER PUBLICATIONS

PCB Trace Width Calculator. Advanced Circuits. Accessed at http://www.4pcb.com/trace-width-calculator.html on Jul. 17, 2020. 2 pages.
(Continued)

*Primary Examiner* — Jay Patidar
(74) *Attorney, Agent, or Firm* — Smith Baluch LLP

(57) ABSTRACT

A nuclear magnet resonance (NMR) system probes samples using a stochastically pulsed radio-frequency magnetic field. The NMR system uses active shims to compensate for spatial inhomogeneity in the bias magnetic field applied by a small permanent magnet. The active shim, made of a flexible conductor, creates a magnetic field when current is passed through it. The magnetic field created by the active shim can compensate for a first, second or third order spherical harmonic spatial inhomogeneity. The NMR system may have an array of active shims, with each active shim compensating for a spherical harmonic spatial inhomogeneity. The array of active shims may be arranged within the NMR system so as to increase power efficiency. The NMR system can accommodate a standard NMR sample tube and can be used to measure nuclear spin density or acquire an NMR spectrum.

30 Claims, 13 Drawing Sheets

(51) Int. Cl.
  *G01R 33/383* (2006.01)
  *G01N 24/08* (2006.01)

(56) References Cited

U.S. PATENT DOCUMENTS

| | | | |
|---|---|---|---|
| 2003/0112107 A1* | 6/2003 | Forbes | G01R 33/3875 335/301 |
| 2003/0161080 A1 | 8/2003 | Ishikawa et al. | |
| 2004/0032258 A1 | 2/2004 | Blumich | |
| 2004/0164738 A1 | 8/2004 | Raftery et al. | |
| 2009/0045894 A1 | 2/2009 | Aubert | |
| 2011/0080347 A1 | 4/2011 | Steeves et al. | |
| 2011/0260727 A1 | 10/2011 | Punchard et al. | |
| 2013/0009735 A1* | 1/2013 | Nath | G01R 33/3873 335/302 |
| 2013/0066138 A1 | 3/2013 | Rohan et al. | |
| 2013/0082708 A1* | 4/2013 | Yokosawa | A61B 5/055 324/309 |
| 2013/0265047 A1 | 10/2013 | Griswold et al. | |
| 2015/0185255 A1 | 7/2015 | Eaton et al. | |
| 2016/0008602 A1 | 1/2016 | Perryman et al. | |
| 2016/0054407 A1 | 2/2016 | Parizh et al. | |
| 2016/0144200 A1 | 5/2016 | Leach et al. | |
| 2018/0143274 A1 | 5/2018 | Poole et al. | |

OTHER PUBLICATIONS

Peeren, "Stream function approach for determining optimal surface currents." Thesis, Eindhoven University of Technology. (2003). 20 pages.
Peeren, "Stream function approach for determining optimal surface currents." Journal of Computational Physics 191.1 (2003): 305-321.
Phuc et al., "Design and Construction of Light Weight Portable NMR Halbach Magnet." International Journal on Smart Sensing & Intelligent Systems 7.4 (2014), 1555-1578.
PicoSpin™ 45 Series II NMR Spectrometer. Thermo Fisher Scientific. Accessed at https://www.thermofisher.com/order/catalog/product/912A0911?SID=srch-srp-912A0911#/912A0911?SID=srch-srp-912A0911 on Jul. 17, 2020. 2 pages.
Pulsar. Oxford Instruments Magnetic Resonance. Accessed at https://nmr.oxinst.com/products/nmr-spectrometers/pulsar on May 30, 2019. 5 pages.
Raich et al., "Design and construction of a dipolar Halbach array with a homogeneous field from identical bar magnets: NMR Mandhalas." Concepts in Magnetic Resonance Part B: Magnetic Resonance Engineering: An Educational Journal 23.1 (2004): 16-25.
Raynal et al., "Design of a debridement device using impinging jets" Journal of Medical Devices 10.3 (2016): 030938. 2 pages.
Roméo et al., "Magnet field profiling: analysis and correcting coil design." Magnetic Resonance in Medicine 1.1 (1984): 44-65.
Rosen et al., "Magnetic Resonance HST.584J / 22.561," 2006. 84 pages.
Rühli et al., "Non-invasive spatial tissue discrimination in ancient mummies and bones in situ by portable nuclear magnetic resonance." Journal of Cultural Heritage 8.3 (2007): 257-263.
Spinsolve 80 Ultra. Spinsolve Benchtop NMR. Magritek. Accessed at http://www.magritek.com/products/spinsolve/ on Jul. 17, 2020. 2 pages.
Subramanian et al., "RF microcoil design for practical NMR of mass-limited samples." Journal of Magnetic Resonance (1998): 227-231.
Sun et al., "Palm NMR and 1-chip NMR." IEEE Journal of Solid-State Circuits 46.1 (2010): 342-352.
Tavassolian et al., "A Novel Magnetic Relaxation-Based Platform for Hydration Monitoring." IEEE Sensors Journal 14.8 (2014): 2851-2855.
Todt et al., "Water/moisture and fat analysis by time-domain NMR." Food Chemistry 96.3 (2006): 436-440.
Turner, "A target field approach to optimal coil design." Journal of Physics D: Applied Physics 19.8 (1986): L147. 6 pages.
Wong et al., "Discrete analysis of stochastic NMR. I." Journal of Magnetic Resonance (1969) 87.2 (1990): 242-264.
Xu et al., "Shim coils design for halbach magnet based on target field method." Applied Magnetic Resonance 46.7 (2015): 823-836.
Ziessow et al., "Hadamard-NMR-Spektroskopie." Berichte der Bunsengesellschaft für Physikalische Chemie 78.11 (1974): 1168-1179.
Zimmerman, Low-field classroom nuclear magnetic resonance system. Diss. Massachusetts Institute of Technology, 2010. 109 pages.
Application Note 14: Standard Method for Hydrogen Content in Fuels (ASTM D7171-16). Oxford Instruments. Sep. 25, 2017. Accessed at https://nmr.oxinst.com/assets/uploads/14_Hydrogen_in_Fuel.pdf on Jul. 17, 2020. 2 pages.
Application Note 20: Measurement of Calcium Fluoride Content in Fluorospar. Oxford Instruments. Oct. 3, 2018. Accessed at https://nmr.oxinst.com/assets/uploads/MagRes/App%20Notes/MQC/MR_Calcium%20Fluoride_App_Note.pdf on Jul. 17, 2020. 3 pages.
Application Note 21: Measurement of Fluorine Content in Alumina. Oxford Instruments. Oct. 3, 2018. Accessed at https://nmr.oxinst.com/assets/uploads/MagRes/App%20Notes/MQC/MR_Fluorine_App_Note.pdf on Jul. 17, 2020. 3 pages.
Application Note 25: Determination of grease content for water quality monitoring using the MQC+23. Oxford Instruments. Oct. 9, 2018. Accessed at https://nmr.oxinst.com/assets/uploads/25_MQC_app_note_25_Determination_of_grease_content_for_water_quality_monitoring.pdf on Jul. 17, 2020. 3 pages.
Application Note 5: Measurement of Fluoride Content in Toothpaste. Oxford Instruments. Jul. 28, 2014. Accessed at https://nmr.oxinst.com/assets/uploads/documents/Measurement-of-Fluoride-Content-in-Toothpaste_AN-5.pdf on Jul. 17, 2020. 3 pages.
Application Note 8: Measurement of Oil Content in Jatropha curcas seeds. Oxford Instruments. May 10, 2018. Accessed at https://nmr.oxinst.com/assets/uploads/8-Measurement-of-Oil-Content-in-Jatropha-Curcas-Seeds.pdf on Jul. 17, 2020. 2 pages.
Bain et al., "Exact solution to the Bloch equations and application to the Hahn echo." Journal of Magnetic Resonance 206.2 (2010): 227-240.
Blümich et al., "2D NMR Spectra from Stochastic NMR. Coupling and Exchange Information from Third Order Frequency Kernel." Berichte der Bunsengesellschaft für physikalische Chemie 84.11 (1980): 1090-1102.
Blümich et al., "Nonlinear noise analysis in nuclear magnetic resonance spectroscopy. 1 D, 2 D, and 3 D spectra." The Journal of Chemical Physics 78.3 (1983): 1059-1076.
Blümich et al., "Saturation in Hadamard NMR spectroscopy and its description by a correlation expansion." Journal of Magnetic Resonance (1969) 46.3 (1982): 385-405.
Blümich et al., "Stochastic NMR on a commercial spectrometer." Journal of Magnetic Resonance (1969) 58.1 (1984): 149-151.
Blümich, "Multi-dimensional spectroscopy: II. Analysis of 3D lineshapes obtained from stochastic NMR of two level systems." Molecular Physics 485 (1983): 969-980.
Blümich, "Stochastic excitation." eMagRes (2007). 10 pages.
Blümich, "Stochastic NMR spectroscopy." Bulletin of Magnetic Resonance 7.1 (1985): 5-26.
Chandrana et al., "Automatic alignment of multiple magnets into Halbach cylinders." Journal of Magnetism and Magnetic Materials 381 (2015): 396-400.
Chen et al., "An ultra-low cost NMR device with arbitrary pulse programming." Journal of Magnetic Resonance 255 (2015): 100-105.
Cooley, Portable low-cost magnetic resonance imaging. Diss. Massachusetts Institute of Technology, 2014. 153 pages.
Danieli et al., "Mobile sensor for high resolution NMR spectroscopy and imaging." Journal of Magnetic Resonance 198.1 (2009): 80-87.
Danieli et al., "Small magnets for portable NMR spectrometers." Angewandte Chemie International Edition 49.24 (2010): 4133-4135.
De Graaf et al., "B0 Shimming Technology." Magnetic Resonance Technology. 2016. 166-207.
Demas et al., "Electronic characterization of lithographically patterned microcoils for high sensitivity NMR detection." Journal of Magnetic Resonance 200.1 (2009): 56-63.

(56) References Cited

OTHER PUBLICATIONS

Demas et al., "Portable, low-cost NMR with laser-lathe lithography produced microcoils." Journal of Magnetic Resonance 189.1 (2007): 121-129.
Eidmann et al., "The NMR MOUSE, a mobile universal surface explorer." Journal of Magnetic Resonance, Series A 122.1 (1996): 104-109.
Ernst, "Magnetic resonance with stochastic excitation." Journal of Magnetic Resonance (1969) 3.1 (1970): 10-27.
Ernst, "Measurement and control of magnetic field homogeneity." Review of Scientific Instruments 39.7 (1968): 998-1012.
Ernst, "Nuclear magnetic resonance Fourier transform spectroscopy." Bioscience Reports 12.3 (1992): 143-187.
Facility NMR Spectrometers. Department of Chemistry Instrumentation Facility Massachusetts Institute of Technology. Accessed at http://web.mit.edu/speclab/www/Facility/nmr.html on May 30, 2019. 3 pages.
Finstad, Flexible Circuit Design and Manufacturing. Flexible Circuit Technologies. 2015. Accessed at https://www.flexiblecircuit.com/wp-content/uploads/2015/08/Flexible_Circuit_Technologies_Design_Tips.pdf. 6 pages.
Flex Circuit Boards. PCB Universe. [Online]. Accessed at http://www.pcbuniverse.com/pcbu-flex-pcb.php on Jul. 17, 2020. 2 pages.
Flexible Circuit & Heater Design Guide, 2008. Flexible Circuit Technologies. Accessed at https://www.flexiblecircuit.com/wp-content/uploads/2015/08/FCT_Design_Guidel_pdf. 24 pages.
Hugon et al., "Design of arbitrarily homogeneous permanent magnet systems for NMR and MRI: Theory and experimental developments of a simple portable magnet." Journal of Magnetic Resonance 2051 (2010): 75-85.
Hugon et al., "Design, fabrication and evaluation of a low-cost homogeneous portable permanent magnet for NMR and MRI." Comptes Rendus Chimie 13.4 (2010): 388-393.
Hugon et al., "Generalized shim and gradient generation: Application to the magic angle field spinning case" Microporous and Mesoporous Materials 178 (2013): 31-33.
Instructional Tabletop MRI Scanner Wiki. Martinos Center for Biomedical Imaging, Massachusetts General Hospital. Last modified Mar. 23, 2020. Accessed at https://tabletop.martinos.org/index.php/Main_Page on Jul. 17, 2020. 3 pages.
International Search Report and Written Opinion in International Patent Application No. PCT/US2020/031650 dated Oct. 1, 2020, 16 pages.
Jakes et al., "Authentication of beef versus horse meat using 60 MHz 1H NMR spectroscopy." Food Chemistry 175 (2015): 1-9.
Kaiser, "Application of the Hadamard transform to NMR spectrometry with pseudonoise excitation." Journal of Magnetic Resonance (1969) 15.1 (1974): 44-63.
Kitamura et al., "The study to improve the field homogeneity of the HTS bulk magnets for NMR relaxometry device by passive compensation methods." Physics Procedia 58 (2014): 298-301.
Li et al. "Simple procedure for the fabrication of flexible NMR shim coils." Comptes Rendus Chimie 16.11 (2013): 967-971.
Liu et al., "An efficacious target-field approach to design shim coils for Halbach magnet of mobile NMR sensors." Applied Magnetic Resonance 42.1 (2012): 101-112.
Mackenzie et al., "A simple field map for shimming." Magnetic Resonance in Medicine 5.3 (1987): 262-268.
Magin et al., "Miniature magnetic resonance machines." IEEE Spectrum 34.10 (1997): 51-61.
Manz et al., "A simple, small and low cost permanent magnet design to produce homogeneous magnetic fields." Journal of Magnetic Resonance 1921 (2008): 131-138.
McDowell et al., "Ultracompact NMR: 1 H spectroscopy in a subkilogram magnet." Applied Magnetic Resonance 35.1 (2008): 185-195.
Mendoza, The modeling and characterization of a Lorentz-force actuator for needle-free injection. Diss. Massachusetts Institute of Technology, 2011. 68 pages.
Moresi et al., "Miniature permanent magnet for table-top NMR." Concepts in Magnetic Resonance Part B: Magnetic Resonance Engineering: An Educational Journal 19.1 (2003): 35-43.
Nath et al., "The "Shim-a-ring" magnet: Configurable static magnetic fields using a ring magnet with a concentric ferromagnetic shim." Applied Physics Letters 102.20 (2013): 202409. 5 pages.
NMR Permanent Magnet PM-1055. MetroLAB Instruments SA. Sep. 22, 2006. Accessed at https://gmw.com/wp-content/uploads/2019/03/WEB_CHEMIN_111_1183360358.pdf on Jul. 20, 2020. 2 pages.
NMReady-60PRO. Nanalysis. Accessed at https://www.nanalysis.com/nmready-60pro on Jul. 17, 2020. 4 pages.
Paff et al., "Reduction of systematic noise in stochastic-excitation NMR by oversampling." Journal of Magnetic Resonance, Series A 102.3 (1993): 332-343.

* cited by examiner

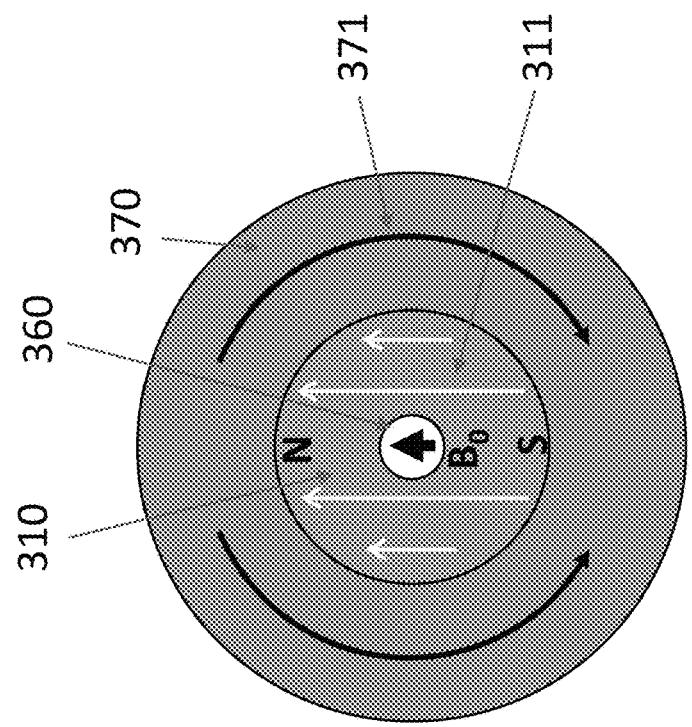
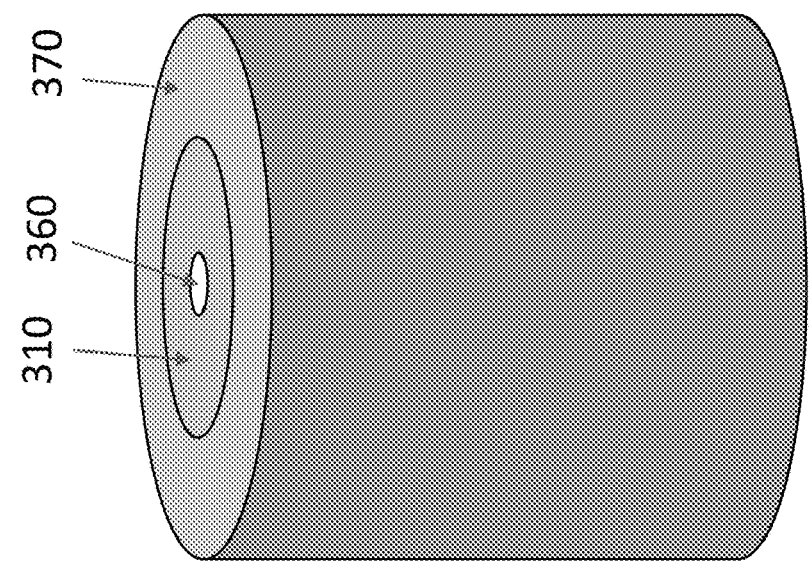
FIG. 3

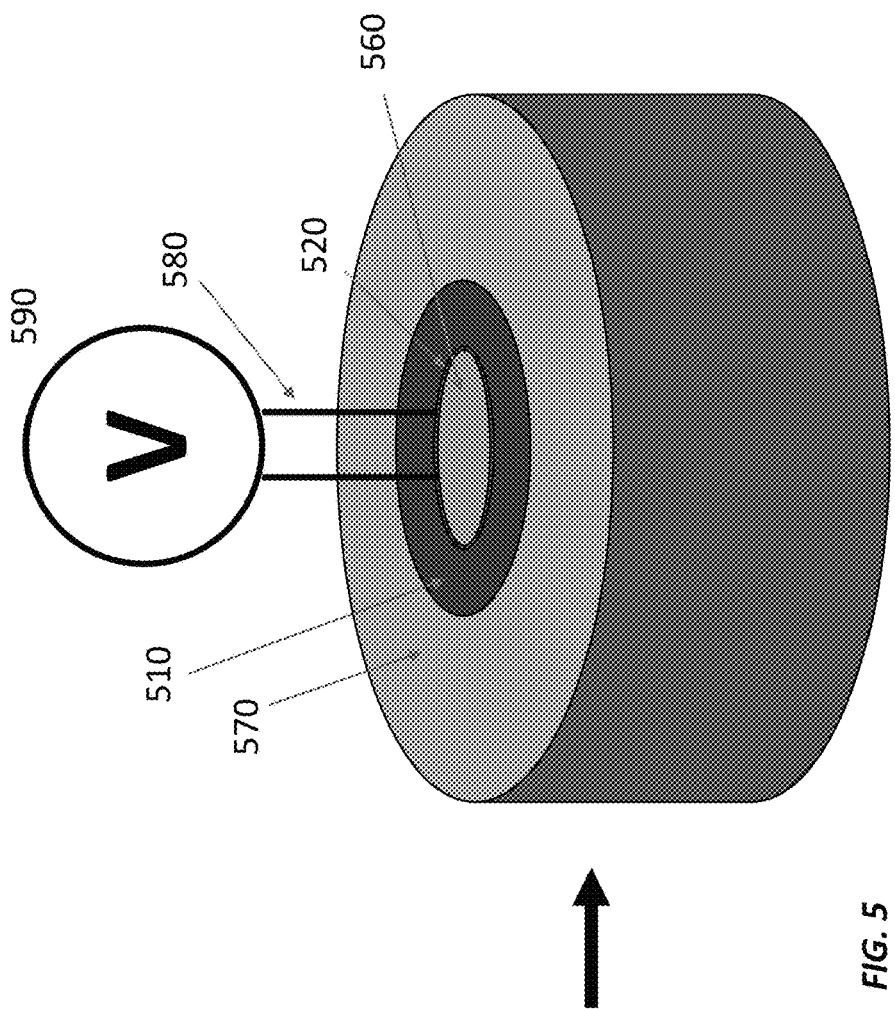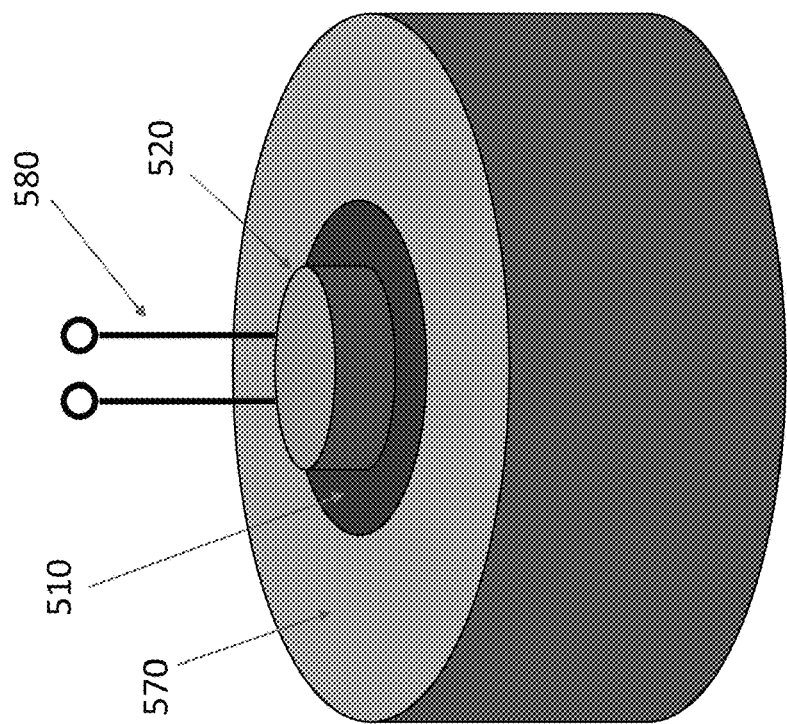
FIG. 5

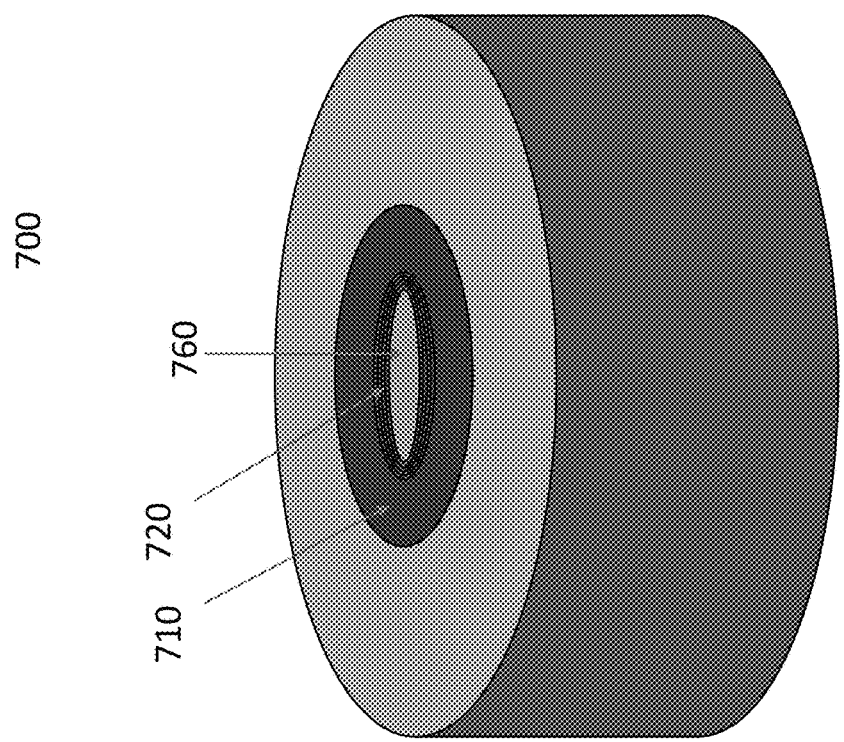
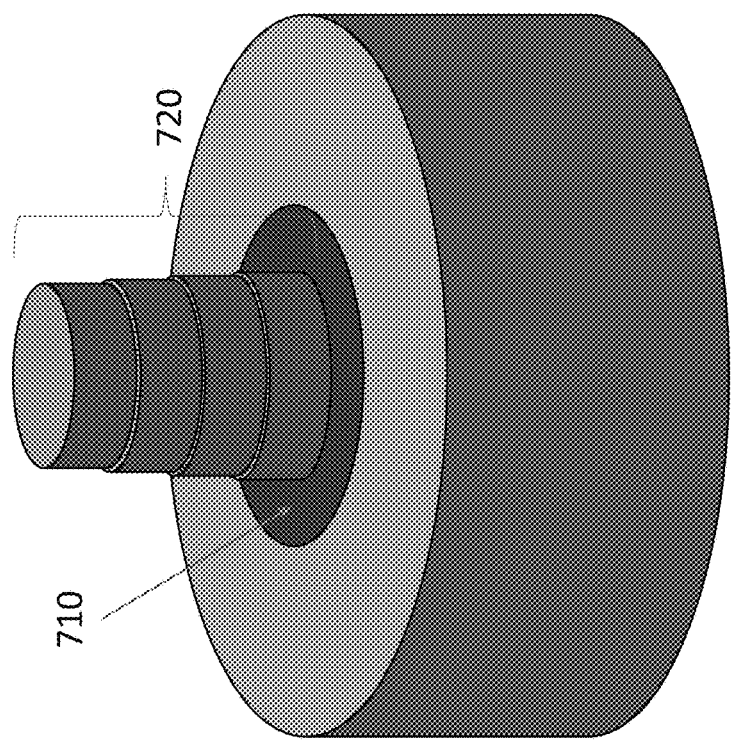
FIG. 7

MINIATURE STOCHASTIC NUCLEAR MAGNETIC RESONANCE

CROSS-REFERENCE TO RELATED APPLICATION(S)

This application is a national-phase application, under 35 U.S.C. 371, of International Application No. PCT/US2020/031650, filed on May 6, 2020, which in turn claims the priority benefit, under 35 U.S.C. § 119(e), of U.S. Application No. 62/843,769, filed on May 6, 2019, each of which is incorporated herein by reference in its entirety.

BACKGROUND

Nuclear magnetic resonance (NMR) spectroscopy is a technique to measure the intramolecular magnetic fields around atoms in molecules. NMR signals can be measured from atomic nuclei that have spin. When a sample of spins is placed in a bias magnetic field, it develops a net magnetic moment aligned with the field. In the bias magnetic field, the angular momentum and magnetic moment of a spin cause the spin to precess about the axis of the field. The frequency of precession is called the Larmor frequency. It is proportional to the strength of the magnetic field. Radio-frequency (rf) pulses whose frequency closely matches the Larmor frequency are used to tip the net magnetic moment away from the bias magnetic field and induce nuclear magnetic resonance.

The nuclear magnetic resonance can be detected with a detection coil, where the nuclear magnetic resonance changes the magnetic flux through the coil, inducing an oscillating voltage. An NMR spectrometer can detect and record the oscillating voltage in the coil, which is called the Free Induction Decay (FID). The FID is a measure of relaxation as the spins fall out of phase with each other. The FID is dependent on the homogeneity of the bias magnetic field and the chemical environment of the sample. An NMR spectrum is computed by taking the Fourier transform of the FID. Chemical shielding and other effects on the local magnetic field at a nucleus create characteristic NMR spectra that allow characterization of the structure of molecules in a sample. Alternatively, the FID can be used to measure a spin density. At its core, an NMR spectrometer is a device that creates a net magnetic moment of spins, uses rf pulses to flip the net magnetization, and records the FID.

Recently, there has been interest in creating simpler, more compact NMR systems. The decreased cost and increased portability of miniature NMR systems would create opportunities for its use in a range of new applications. Previous research efforts have demonstrated NMR spectroscopic measurements using a miniature NMR system. However, significant barriers remain. Existing miniature NMR systems are expensive, difficult to assemble, and have arduous setup and calibration procedures. Additionally, existing systems often take skilled users and have high power consumption. There exists a need for a miniature NMR system with a simple design, easy assembly, lower power consumption, and simple setup and calibration procedures.

SUMMARY

Embodiments of the present technology include a stochastic nuclear magnetic resonance (NMR) system. The stochastic NMR system includes a permanent magnet, an active shim, an electromagnet, a detector, and a processor. In operation, the permanent magnet applies a bias magnetic field to a sample. The active shim compensates a spatial inhomogeneity in the bias magnetic field applied to the sample by the permanent magnet. The electromagnet applies a stochastically pulsed radio-frequency magnetic field to the sample. The detector senses responses from the sample to the stochastically pulsed radio-frequency magnetic field. The processor, which is operably coupled to the detector, determines a spin density of the sample based on the responses from the sample.

The stochastic NMR system may not comprise an adjustable passive shim for compensating a spatial inhomogeneity in the bias magnetic field. The stochastic NMR system may weigh less than 1 kilogram.

The permanent magnet may define a cylindrical sample space, in which case the active shim may comprise a flexible conductor disposed along a surface of the cylindrical sample space. The cylindrical sample space may have a diameter of about 6 mm to about 10 mm. The permanent magnet may have an axial length of about 40 mm to about 60 mm and the axial length may be selected to decrease the spatial inhomogeneity in the bias magnetic field in the cylindrical sample space. The sample may be in a sample volume with an inner diameter of about 3 mm to about 5 mm and the detector may sense responses from the sample volume.

The stochastic NMR system may further comprise a steel shim encasing the permanent magnet, wherein the size and shape of the steel shim are selected so that the steel shim superimposes with regions of flux density of the bias magnetic field that are higher than 0.4 T. The bias magnetic field may have a field strength of about 0.48 T to about 2 T.

The active shim may be configured to compensate for a second-order spherical harmonic spatial inhomogeneity in the bias magnetic field. The active shim may be configured to compensate for a third-order spherical harmonic spatial inhomogeneity in the bias magnetic field. The active shim may include a flexible printed circuit board having traces with shapes based on the spatial inhomogeneity in the bias magnetic field. The flexible printed circuit board may include two layers of traces separated by a layer of insulation, where the two layers are electrically connected with a via. The traces may be comprised of metal and may be about 70 µm wide.

The stochastic NMR system may include an array of active shims. The array of active shims may be spatially arranged to increase power efficiency so that the overall power consumption of the active shims is less than 5 W. The array of active shims may be arranged so that active shims with lower power efficiency relative to other active shims in the array of active shims are closer to a cylindrical sample space. The active shim may be configured to compensate the spatial inhomogeneity in the bias magnetic field by applying a magnetic field to the sample while the electromagnet applies the stochastically pulsed radio-frequency magnetic field to the sample.

The stochastically pulsed radio-frequency magnetic field may have a duration of about 10 ms to about 400 ms, a duty cycle of up to about 25% to about 50%, a pulse amplitude of $1V_{pp}$ to $4V_{pp}$, and a pulse repetition frequency of about 2 kHz to about 100 kHz. The detector may be configured to measure an amplitude of the response about 3 µs after each pulse in the stochastically pulsed radio-frequency magnetic field.

The stochastic NMR system may be configured to measure the spin density of at least one of $^1H$, $^{13}C$, $^{19}F$, $^{17}O$, $^{11}B$, or $^{31}P$. The spin density may be used to measure at least one of a concentration of hydrogen in fuel, a concentration of oil in food, and a concentration of fluorine in toothpaste. The stochastic NMR system may be additionally configured to determine an NMR spectrum of the sample based on the responses from the sample. The stochastic NMR system may be configured to perform multi-dimensional NMR spectroscopy.

The method to measure a spin density of a sample may comprise applying a bias magnetic field to a sample, compensating a spatial inhomogeneity in the bias magnetic field, applying a stochastically pulsed radio-frequency magnetic field to the sample, generating responses from the sample to the stochastically pulsed radio-frequency magnetic field, detecting responses from the sample, and determining a spin density of the sample based on the responses from the sample. In this method, the bias magnetic field is generated by a permanent magnet. An active shim compensates spatial inhomogeneity. An electromagnet applies the stochastically pulsed radio-frequency magnetic field to the sample. Responses from the sample are detected by a detector. A processor, which is operably coupled to the detector, determines a spin density based on the responses from the sample.

The bias magnetic field used in the method may also have a field strength of about 0.48 T to about 2 T. The method may also include compensating for a second-order spherical harmonic spatial inhomogeneity in the bias magnetic field. The method may also include compensating for a third-order spherical harmonic spatial inhomogeneity in the bias magnetic field.

The stochastically pulsed radio-frequency magnetic field may have a duration of about 10 ms to about 400 ms, a duty cycle of up to about 25% to about 50%, a pulse amplitude of $1V_{pp}$ to $4V_{pp}$, and a pulse repetition frequency of about 2 kHz to about 100 kHz. The method may also measure an amplitude of the response about 3 µs after a trailing edge of each pulse in the stochastically pulsed radio-frequency magnetic field. The method may also include operating the active shim at a current density of up to about $10^8$ A/m².

Another embodiment of the present technology includes a nuclear magnetic resonance (NMR) system comprising a permanent magnet, an active shim, an electromagnet, a detector, and a processor. The permanent magnet applies a bias magnetic field to a sample. The active shim compensates a spatial inhomogeneity in the bias magnetic field applied to the sample by the permanent magnet. The electromagnet applies a pulsed radio-frequency magnetic field to the sample. The detector senses responses from the sample to the pulsed radio-frequency magnetic field. The processor, which is operably coupled to the detector, determines a Fourier-transform NMR spectrum of the sample based on the responses from the sample. The pulsed radio-frequency magnetic field may have a duration of about 10 ms to about 400 ms, and a pulse amplitude of 10 $V_{pp}$ to 80 $V_{pp}$.

All combinations of the foregoing concepts and additional concepts discussed in greater detail below (provided such concepts are not mutually inconsistent) are part of the inventive subject matter disclosed herein. In particular, all combinations of claimed subject matter appearing at the end of this disclosure are part of the inventive subject matter disclosed herein. The terminology used herein that also may appear in any disclosure incorporated by reference should be accorded a meaning most consistent with the particular concepts disclosed herein.

BRIEF DESCRIPTIONS OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally and/or structurally similar elements).

FIG. 3 is a schematic of a permanent magnet suitable for use in the miniature stochastic NMR system of FIGS. 2A and 2B.

FIG. 5 is a schematic illustrating an active shim suitable for use in the miniature stochastic NMR system of FIGS. 2A and 2B.

FIG. 7 is a schematic of an array of active shims in relation to a permanent magnet.

DETAILED DESCRIPTION

NMR experiments that use stochastic excitation hold great promise for miniature NMR spectrometers. Stochastic NMR systems use less power than typical pulsed NMR systems, making them ideal for a portable device. Stochastic NMR systems use excitation pulses that are orders of magnitude smaller than those in the more common pulse NMR techniques.

Figure 1:
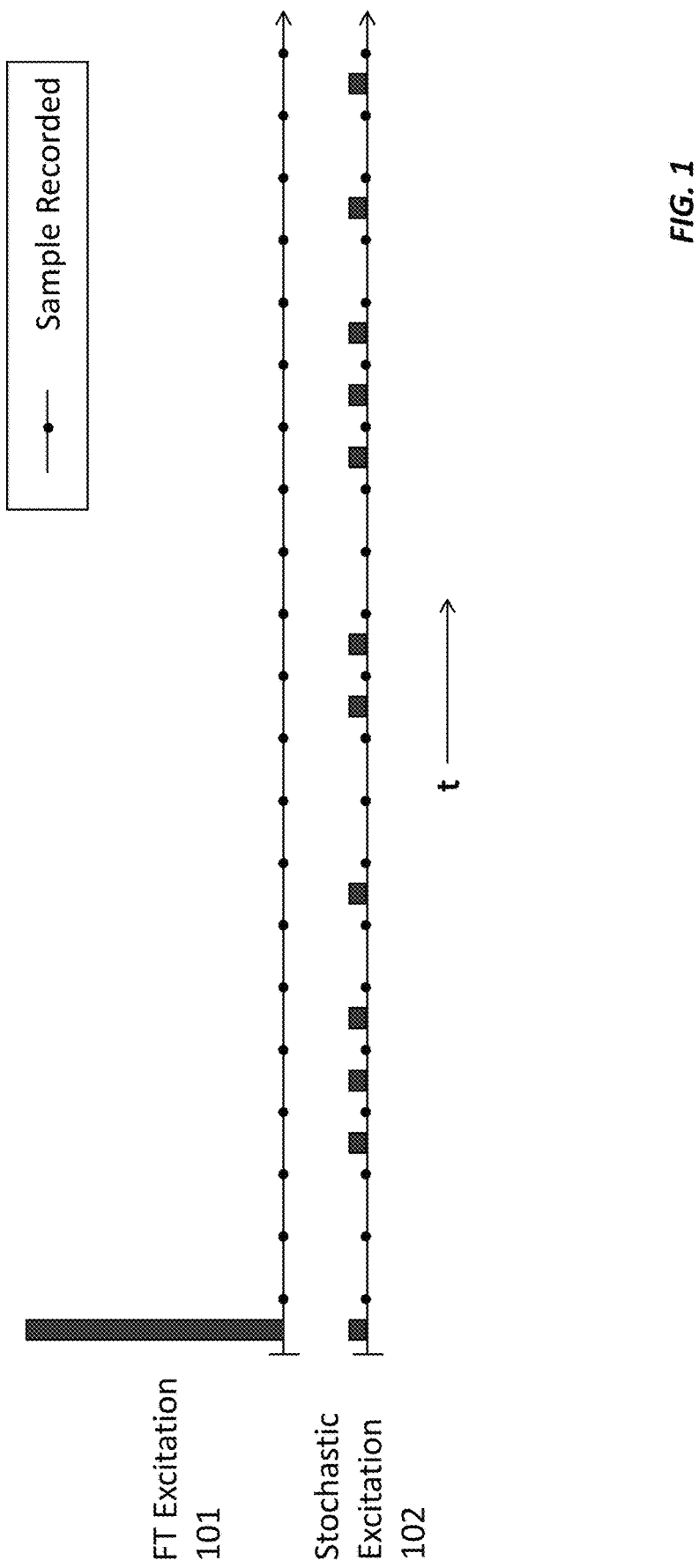
FIG. 1 is a schematic comparison of a common pulse NMR excitation (top) and a stochastic NMR excitation (bottom).

FIG. 1 illustrates the difference between common pulse NMR measurements and stochastic NMR measurements. As shown in FIG. 1, common pulse NMR experiments use a single large (90-degree) rf pulse 101 to polarize a sample. The sample relaxes back into thermal equilibrium by emitting an FID pulse before another rf pulse polarizes the sample. The sample's impulse response is equivalent to the FID, which is the raw NMR response recorded after the 90-degree pulse. In stochastic NMR, a series of small stochastic rf pulses 102 polarize a sample, with each pulse provoking a separate free induction decay. The series of pulses 102 is stochastically modulated in either amplitude, phase, duration, frequency, or a combination thereof. The NMR signal detected by the detector in a stochastic NMR experiment is a superposition of the responses to all of the previous pulses. Deconvolution of this NMR signal can then allow for extraction of the FID. For example, in stochastic NMR, system identification techniques can be used to calculate the impulse response of the sample. Stochastic NMR performs the same measurement as a simple pulse NMR experiment, albeit in a less intuitive way.

Because the excitation power is spread over a larger portion of the duration of the experiment, the peak magnitude of the individual pulses in stochastic NMR is much smaller than the peak pulse magnitude in common pulse NMR experiments. And because the pulses in stochastic NMR are up to two orders or magnitude smaller than in pulse NMR, the technique uses much less power, which is an advantage for a miniature, portable device. The lower power pulses also significantly reduce the demand on the electronics, both in generating the pulses, and in isolating the sensitive detection equipment from the excitation pulses.

Stochastic NMR System

A stochastic NMR system's experimental ease of use makes it a good choice for a small, inexpensive device intended for wide implementation. The data processing can be automated, with the excitation frequency and excitation power as the experimental parameters to be adjusted.

Figure 2A:
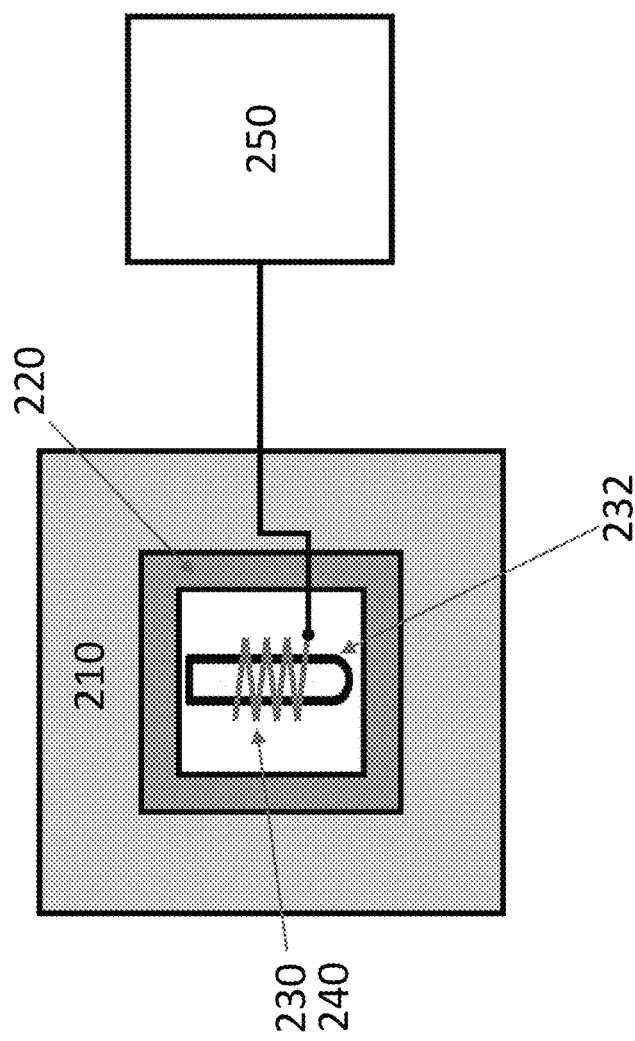
FIGS. 2A and 2B are diagrams of a miniature stochastic NMR system.

FIG. 2A shows a schematic of a stochastic NMR system 200 in which nuclear spins within a sample can be aligned with a bias magnetic field and excited into nuclear magnetic resonance with rf pulses. The stochastic NMR system 200 includes a permanent magnet 210, which applies the bias magnetic field to the sample. The NMR system 200 also comprises an active shim 220 to compensate a spatial inhomogeneity in the bias magnetic field. An NMR signal in the sample is induced by the electromagnet 230, which can supply a series of small, stochastically modulated rf pulses 102. The NMR signal is detected by a detector 240, and the signal is then processed by a processor 250. The NMR signal can be processed to produce an FID spectrum, which can give data on spin density or further be processed to provide an NMR spectrum.

There are two modules within the stochastic NMR system. The permanent magnet 210, the active shim 220, and the electromagnet 230 are housed in one of the modules. The electromagnet 230 may be an electromagnetic coil. The electromagnet 230 sits within the active shim 220 and the active shim 220 sits within the permanent magnet 210. The magnetic field generated by the active shim will superpose with the bias magnetic field generated by the permanent magnet. A sample 232 may sit within the electromagnet 230 and an NMR signal in the sample 232 may be induced by the electromagnet 230. The electromagnet 230 may also act as the detector 240 to detect the NMR signal from the sample. The electronic components for the stochastic NMR system 200, including the processor 250, may be housed in a second module. The detector 240 is electrically connected to the electromagnet 230 and the processor 250. The components housed in the second module may be miniaturized onto a single chip. The stochastic NMR system 200, including the two modules, weighs less than 1 kilogram. The system's low weight provides the possibility of system portability.

Figure 2B:
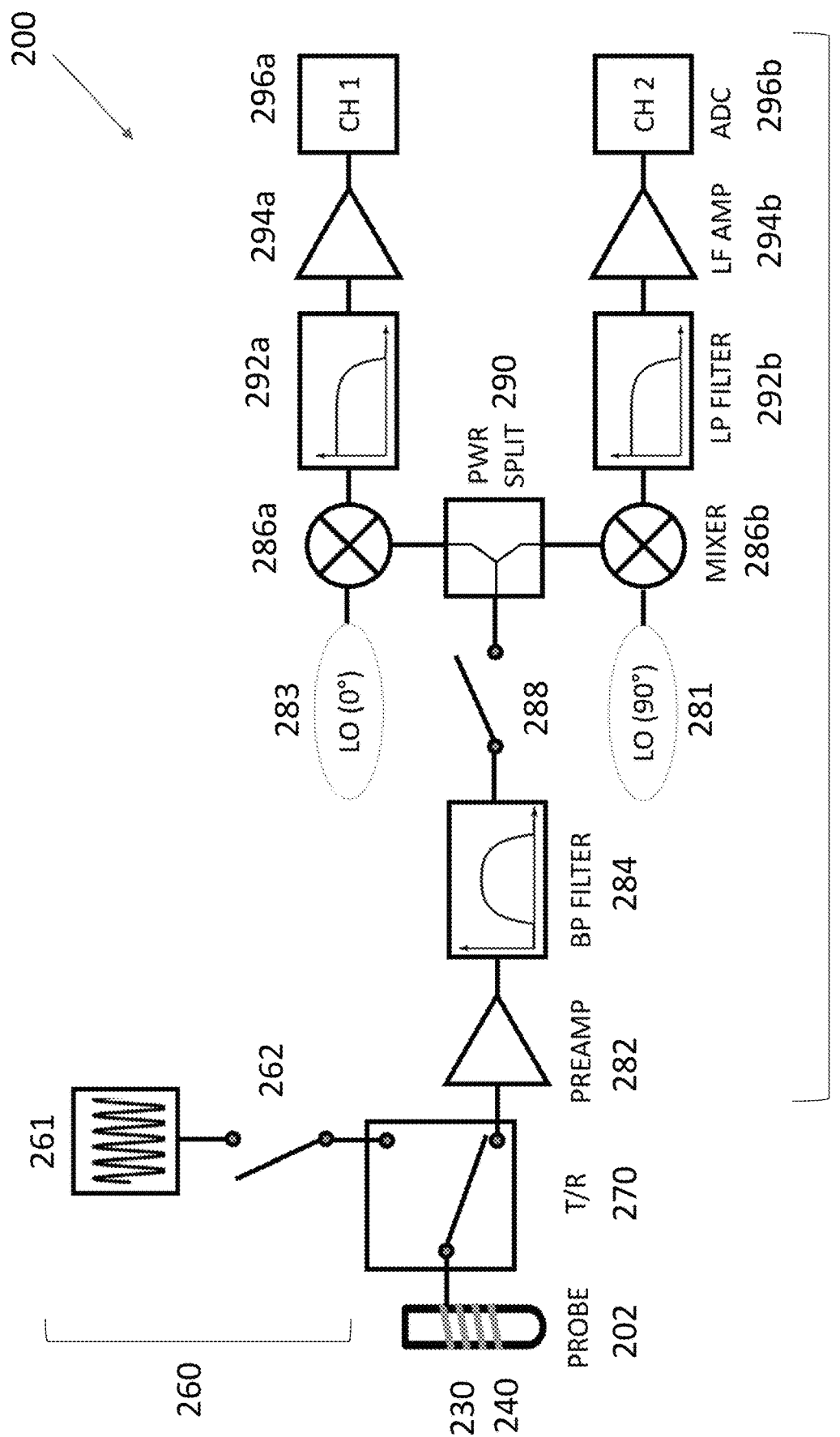

FIG. 2B shows a more detailed block diagram of the stochastic NMR system 200. The NMR system includes a probe 202, a transmitter pathway 260, and a receiver pathway 280. The probe 202 comprises components to transmit the signals from the transmitter pathway 260 to the sample and receive the rf signals in the receiver pathway 280. The probe 202 also defines a sample position. The transmitter pathway 260 comprises components to generate a rf signal to induce NMR in a sample. The receiver pathway 280 comprises components to record the NMR signal from the sample.

Figure 2C:
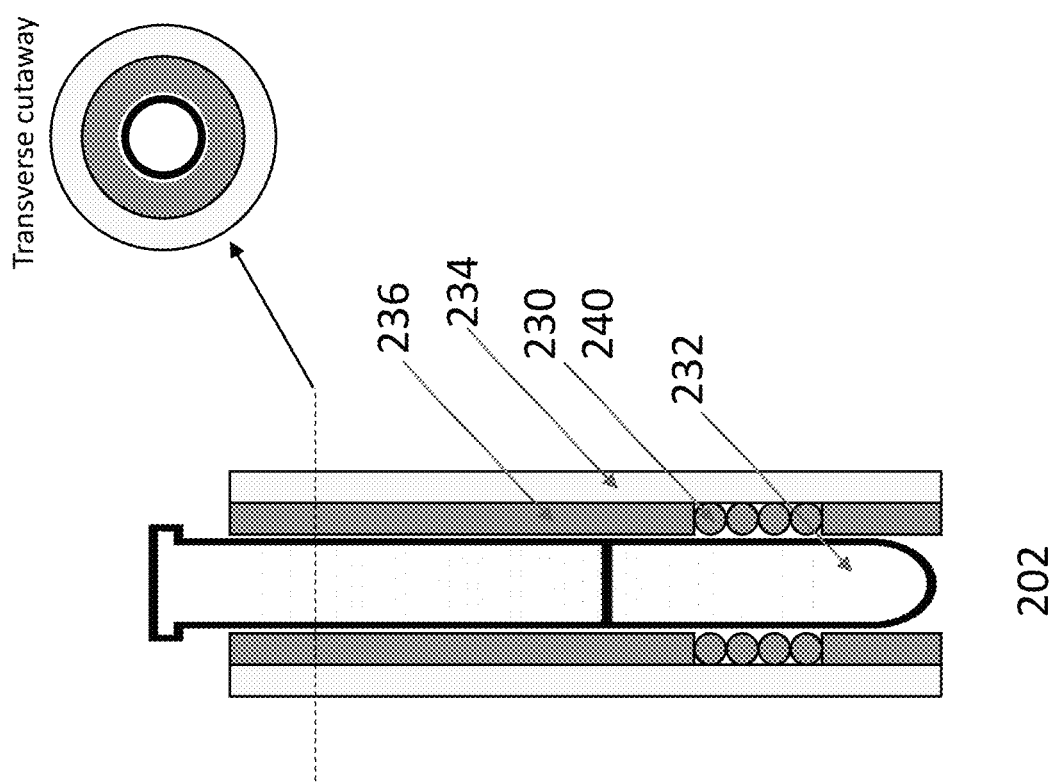
FIG. 2C is a diagram of the probe within the miniature stochastic NMR system of FIGS. 2A and 2B.

FIG. 2C depicts a detailed cross-sectional diagram of the probe 202 within the stochastic NMR system 200. The probe 202 comprises an electromagnet coil 230, which applies the rf signal to the sample 232 to induce an NMR signal. The probe 202 also positions and holds the sample 232 in the bias magnetic field. The probe 202 can additionally include a detector 240 to detect the NMR signal from the sample. The electromagnet coil 230 providing the rf signal can be the same structure used as a detector 240 to detect the NMR signal from the sample.

A solenoidal coil is commonly used in NMR because it generates a homogeneous rf field while allowing a large cylindrical sample volume. Inductance and resistance in the solenoidal coil are balanced to increase the signal-to-noise ratio (SNR) in stochastic NMR measurements.

Inductance increases with the number of turns in the solenoidal coil. The inductance increase produced by increasing the number of turns in the coil is offset by the resistance. The gauge of the wire used to make the solenoidal coil can be decreased to increase the number of turns. However, the resistance of the coil increases as the gauge of the wire decreases. For example, the solenoidal coil can have 5 turns of 2.5 mm outer diameter magnet wire wound around a sample tube. Alternatively, the solenoidal coil can have 5 turns of 23-gauge (0.58 mm outer diameter) wire wrapped around a 1.7 mm outer diameter sample tube. Each of these embodiments can have an inductance of about 75-120 nH and a resistance of 90-200 mΩ.

To build the probe, magnet wire may be wound directly around a glass sample tube and secured with a small amount of adhesive. Alternatively, the probe 202 may be designed to allow sample tubes to be easily inserted and removed in order to allow rapid testing of a series of samples while maintaining equivalent performance. In one embodiment, carbon fiber cylinder guides 236 are placed on either side of the electromagnet 230 and the structure is secured with a polymer backbone 234, as shown in FIG. 2C. In another embodiment, an additional solenoidal coil is fixed to the interior of a cylinder guide within the cylindrical sample space.

The transmitter pathway 260 comprises a waveform generator 261 and a switch 262. The waveform generator 261 provides a stochastically modulated rf signal. The waveform generator 261, when gated, provides the rf excitation pulses 102 that enable the stochastic NMR system 200. The waveform generator 261 is gated by the switch 262. The switch 262 isolates the rf excitation pulses 102 from the detector 240. The transmitter pathway 260 may additionally comprise an amplifier to amplify the rf signal prior to reaching the sample.

The stochastic NMR system additionally comprises a transmit/receive switch 270 that connects the probe 202 to the transmitter pathway 260 and the receiver pathway 280. The transmit/receive switch 270 couples the rf excitation pulses 102 to the probe 202 and isolates the rf excitation in the transmitter pathway 260 from the rf detection (NMR signal) in the receiver pathway 280.

The receiver pathway 280 comprises several components to amplify and aid in the deconvolution of the rf signal detected by the detector 240 in the Stochastic NMR system. A low-noise preamplifier 282 amplifies the NMR signal. A bandpass filter 284 coupled to the preamplifier 282 filters the NMR signal to eliminate noise and other undesired spectral components. The bandpass filter 284 may have a bandwidth of about 1 MHz. An additional switch 288 coupled to the bandpass filter 284 may be added to the system to further isolate the receiver pathway from the rf excitation pulses 102 that may leak through the transmit/receive switch, though this component is not necessary.

A power splitter 290 directs the NMR signal into two channels for quadrature detection. Each channel has a mixer 286*a*, 286*b* to mix the NMR signal with an in-phase or quadrature local oscillator. The local oscillators can be the same frequency as the excitation pulses; they can also be frequency-shifted for heterodyne detection. The in-phase local oscillator 283 is at a relative phase of 0° and the quadrature local oscillator 281 is at a relative phase offset of 90°. Mixing the copies of the signal with the in-phase and quadrature local oscillators yields in-phase and quadrature sum and difference frequencies. A low pass filter 292*a*, 292*b* in each channel then selects the corresponding difference frequency while screening out the sum frequency. An amplifier 294*a*, 294*b* may then further amplify the NMR signal in each channel. Finally, the NMR signal in each channel is digitized by a corresponding analog-to-digital converter (ADC) 296*a*, 296*b*. The digital outputs of the ADCs 296*a*, 296*b* can be stored in memory for further processing.

Suitable Permanent Magnet Assemblies

Suitable permanent magnets 210 for the stochastic NMR system 200 provide strong and homogeneous bias magnetic fields. For a miniature stochastic NMR system, the permanent magnet should be small and lightweight while still providing a sufficiently strong and homogeneous magnetic field. Suitable materials for the permanent magnet 210 include rare earth elements, such as neodymium iron boron. The permanent magnet 210 may provide a bias magnetic field of between 0.48 and 2 T and may weigh less than one kilogram.

The permanent magnet 210 may be incorporated into a permanent magnet assembly. Example functional specifications of a permanent magnet assembly suitable for a miniature stochastic NMR system are as follows:
 1. Low mass: The design should be small and light enough to be handheld.
 2. Strong magnetic field: Preferably at least 0.48 T is used to perform spectroscopy
 3. Homogeneous: The region of interest should be as homogeneous as possible, or, alternatively, the homogeneous region should be as large as possible.
 4. Manufacturability: The raw material and assembly costs should be minimized.

Examples of permanent magnet assemblies that may be used in stochastic NMR systems include an iron yoke, a Halbach array, an Aubert configuration, and a shim-a-ring. Each of these examples has a particular aspect of interest. Each of these permanent magnet assembly examples comprises one or more rare earth element magnets. The assemblies may additionally contain a steel structure around the one or more rare earth element magnets. Each version of the permanent magnet assembly defines a sample space within the bias magnetic field where the bias magnetic field is intended to be the most spatially homogeneous.

The iron yoke permanent magnet assembly uses two permanent magnets that are separated by an air gap and oriented such that a magnetic flux travels from one to the other. Iron or steel completes the magnetic loop, forming a flux return path between the permanent magnets. The iron or steel captures the magnetic flux from the two permanent magnets and channels the magnetic flux to pass through the small air gap. An NMR sample is placed in the air gap. The magnitude of the bias magnetic field depends on the size of the air gap, where a smaller gap creates a higher bias magnetic field, and the size of the permanent magnets, where a larger permanent magnet creates a higher bias magnetic field.

Assembling an iron yoke permanent magnet assembly is challenging due to the strong attraction between the permanent magnets and the iron or steel. A jig should be used to guide the permanent magnets into the desired position and the large forces should be carefully managed.

Iron yoke permanent magnet assemblies may range in size from about a meter in diameter, such as those used in permanent magnet MM systems, to palm-sized. Because the homogeneous region is small in a palm-sized iron yoke permanent magnet assembly, the assembly may be used for measurements requiring less homogeneity or for measurements with nanoliter-sized samples.

In a Halbach array permanent magnet assembly, the magnetic material itself provides the flux return path, meaning that a stronger bias magnetic field is achieved compared to designs of equivalent mass where steel is used. A cylindrical Halbach array generates an intense magnetic field interior to a bore. The bore defines a cylindrical sample space. The array is composed of an annulus of magnetic material, whose polarization varies sinusoidally. The cylindrical Halbach array may have a region of increased uniformity of the bias magnetic field within the bore. The magnetization in this design is given in cylindrical coordinates by, $$\vec{M} = M_r[\cos(\theta - \frac{\pi}{2})\hat{r} + \sin(\phi - \frac{\pi}{2})\hat{\theta}],$$

where $M_r$ is the magnetic remanence and $\theta$ is the rotation around the cylinder. The magnetic flux flows unidirectionally through the bore and is returned through each side of the magnet ring.

The Halbach array differs from conventional NMR configurations in that the bias magnetic field is perpendicular to the bore rather than parallel to it. The strength of the bias magnetic field depends on the ratio of the inner and outer radii, $r_{inner}$ and $r_{outer}$, respectively, and is given by $B=B_r \ln(r_{outer}/r_{inner})$, where $B_r$ is the residual flux density. This formula assumes an infinitely long cylindrical Halbach array, and the finite length of the array in practice can cause distortions affecting bias magnetic field strength and homogeneity. These distortions can be minimized by using two layers of permanent magnets spaced at a certain distance apart.

The cylindrical permanent magnet with continuously varying polarization such as in the Halbach array may be difficult to manufacture. Therefore, physical realizations may approximate the single permanent magnet in the Halbach array using multiple discrete permanent magnets. Trapezoidal permanent magnets arranged into a cylindrical shape provide the most faithful approximation and largest bias magnetic field. An alternate configuration uses square or round permanent magnets arranged into an approximate cylindrical shape.

Assembling a Halbach array with discrete permanent magnets may be challenging, particularly for the last few permanent magnet pieces, which are strongly magnetically repelled. Rare earth magnets are brittle, and the large repelling and attracting forces can fracture or crush the magnets.

Techniques have been developed to ease assembly of Halbach arrays that use identical magnets, but in every case use specialized jigs and may take great care and skill to assemble. The challenges of assembling Halbach arrays significantly adds to their cost.

The Aubert configuration permanent magnet assembly is a highly symmetric configuration that creates a homogeneous bias magnetic field in the sample space. The assembly comprises two rings of permanent magnets placed at a certain distance apart. In one ring, all the permanent magnets point radially inwards, while in the other ring, all the permanent magnets point radially outwards. The magnetic flux pushed towards the center of the radially-inward ring is drawn towards the radially outward ring, creating a homogeneous field in the space between the rings. It is noteworthy that because the flux return path in this design is through air, the bias magnetic field generated is weak compared to designs using steel or permanent magnets to close the magnetic circuit.

The principle behind this configuration is to model the bias magnetic field in terms of a spherical harmonic expansion, and then to place permanent magnets in a way to cancel terms of the expansion. The spherical harmonic expansion is an orthonormal basis set whose zero-order term represents the average bias magnetic field value, whose first-order terms represent linear gradients, and so on. With a magnet configuration of n-fold rotational symmetry, the first n−2 orders of skew terms, called tesseral harmonics, are nulled. These tesseral harmonics represent variations in x and y when the field points along z. In addition, the anti-symmetry of the two rings with respect to the xy plane cancels the even orders of the zonal harmonics, the ones varying with z. Finally, the spacing between the two rings is chosen to cancel the first odd zonal harmonic. The higher-order terms are small, and the variations they cause do not take correction. Thus, the symmetries and anti-symmetries of the Aubert configuration permanent magnet assembly are chosen to attain the desired bias magnetic field homogeneity.

FIG. 3 shows a shim-a-ring permanent magnet assembly 300. The shim-a-ring assembly 300 is the simplest of the assemblies described in this section. The assembly includes two pieces: a cylindrical permanent magnet 310 and a steel shim 370 encasing the permanent magnet. The permanent magnet 310 contains a bore that defines a cylindrical sample space 360. The permanent magnet 310 is diametrically magnetized, meaning that the magnetization is perpendicular in a direction orthogonal to the cylindrical sample space 360. The steel shim 370 provides a flux return path 371 for the bias magnetic field 311. In contrast to the Halbach array, the magnetic attraction of the permanent magnet 310 and the steel shim 370 draws them into the desired configuration. The shim-a-ring assembly can be assembled easily by aligning the permanent magnet 310 and the steel shim 370 and allowing them to pull together.

In a miniature stochastic NMR system, the more manageable size and cost is a worthwhile trade-off for the smaller bias magnetic field and reduced resolution. Sub-kilogram permanent magnets for spectroscopy are complex and use significant manufacturing labor, which drives up the cost and lessens the attractiveness of a miniature NMR instrument. Based on this insight, among small permanent magnet designs with field strength and homogeneity sufficient for spectroscopy, the most easily manufactured permanent magnet assembly may be prioritized.

Finite element simulations in COMSOL Multiphysics provide additional information about each type of permanent magnet assembly. These simulations yielded information about the strength and homogeneity of the bias magnetic field in the region of interest. The region of interest was chosen to be a 4 mm cube, which is large enough to accommodate a standard NMR sample tube. The homogeneity was computed by considering the bias magnetic field at 729 points on an evenly spaced grid in the region of interest, with each point separated by half a millimeter. The ppm homogeneity is then given using the following formula:

$$\frac{\sum_{i=1}^{n} \frac{|B_i - B_0|}{B_0} \times 10^6}{n}$$

where $B_i$ is the magnetic field at each sample point, $B_0$ is the bias magnetic field at the center of the homogeneous region, and n is the number of points considered.

The part per million (ppm) variation of the $B_0$ field in reality may be orders of magnitude larger than predicted by simulations. Sources of inhomogeneity include errors in aligning the magnets, variations in magnetic moment between the different pieces, and magnetization imperfections within the individual magnet pieces. The results can be improved by screening the individual permanent magnet pieces and selecting pieces with matched field strength, though shimming afterwards is still used often. The homogeneity information extracted from simulations, therefore, represents a lower bound for the performance of physical permanent magnets, and although not accounting for the above sources of error, it is still an indicator of relative performance between different types of permanent magnet assemblies.

Table 1 shows results of the comparison of permanent magnet assemblies using order-of-magnitude differences. The most common NMR permanent magnet assembly, the iron yoke, was used as a baseline for comparison. Better performance in other assemblies is marked with a '+', worse performance with a '−', and equivalent with a '0'. The shim-a-ring assembly 300 stands out for having similar bias magnetic field strength and homogeneity compared to the other assemblies, in addition to having better manufacturability.

TABLE 1

Order-of-magnitude comparisons between four permanent magnet assemblies, with the Iron Yoke as the standard for comparison.

| Functional Specification | Iron Yoke | Halbach | Aubert | Shim-a-Ring |
|---|---|---|---|---|
| Field Strength per Mass | 0 | + | − | 0 |
| Field Homogeneity | 0 | 0 | + | 0 |
| Manufacturability | 0 | − | 0 | + |

Increasing Spatial Homogeneity in a Permanent Magnet Assembly

Based on the comparison in the previous section, the shim-a-ring permanent magnet assembly 300 was chosen for further experimentation. This permanent magnet assembly 300 meets the desired functional specifications for field strength, mass, predicted homogeneity, and manufacturability for a miniature stochastic NMR system.

The bias magnetic field within the cylindrical sample space should be as homogeneous as possible in order implement NMR experiments. Both the uniformity of the bias magnetic field strength as well as the direction are factors of its homogeneity. However, the bias magnetic field of a permanent magnet 210 is usually inhomogeneous. Sources of inhomogeneity within the bias magnetic field include misalignment and manufacturing imperfections. Homogeneity of the magnetic field strength may factor more heavily in the performance of an NMR experiment, and therefore the homogeneity of the magnetic field direction may be neglected in analyses. The spatial homogeneity of the strength of a bias magnetic field can be measured using a Hall Effect sensor and can be modelled using COMSOL simulations. The spatial homogeneity of a bias magnetic field within a cylindrical sample space in a stochastic NMR system 200 can be increased or decreased, as measured using a Hall Effect sensor, depending on the geometry of the permanent magnet 210 and the permanent magnet assembly. For example, with the diameters of the permanent magnet and steel shim held constant, the axial length of the permanent magnet assembly can be varied to change the spatial homogeneity.

Simulations performed in COMSOL yield dimensions of a shim-a-ring magnet assembly 300 that provide increased spatial homogeneity of the bias magnetic field in the cylindrical sample space 360. Configurations identified by the simulations were experimentally verified. For experimental verification, a Hall Effect sensor (HGT-2101; Lake Shore Cryotronics, OH) was used to assess the homogeneity of the magnetic field. Packaged in a 1.5 mm by 1.5 mm integrated circuit, the active area of the sensor was 0.127 mm by 0.127 mm, thus providing adequate spatial resolution to construct a field map. The sensor was mounted on a custom printed circuit board (PCB). The PCB featured a long arm with the sensor mounted 30 mm down to allow mapping inside the bore of a tall magnet.

The body of the PCB contained a simple operational amplifier circuit to supply constant current to the Hall sensor. The output voltage of the sensor was proportional to both the supplied current and the local magnetic field. With a 5 mA current supplied, the Hall sensor generated 192.5 mV per Tesla of field. The Hall voltage was measured using a nanoVolt meter (34420A; Hewlett-Packard, CA). The Hall sensor was mounted on a 3-axis stage capable of 0.01 mm resolution, and the probe was displaced by hand within the magnet bore.

Two permanent magnet assembly geometries were modeled, constructed, and measured: first, using a commercially available permanent magnet 310 and a custom steel shim 370, and second using a custom permanent magnet 310 and a commercially available steel shim 370. Both designs were predicted to give adequate spatial homogeneity for NMR measurements.

The commercially available permanent magnet was 50.8 mm tall, with a diameter of 50.8 mm and a bore of 6.35 mm (RY04YODIA; K&J Magnetics, PA). The N42 grade neodymium iron boron permanent magnet had a residual flux density of $B_r$=1.32 T. The steel shim was made from low-carbon steel (e.g. 1018 steel) with an inner diameter of 50.8 mm set to match the outer diameter of the permanent magnet. The steel shim outer diameter was 101.6 mm and was selected to be thick enough to return all the magnetic flux without saturating magnetization of the steel shim, thus increasing the strength and homogeneity of the bias magnetic field.

For a miniature stochastic NMR system, the steel shim in a shim-a-ring permanent magnet assembly should be as small as possible while still providing a return path for the magnetic flux of the permanent magnet without saturating its magnetization. The steel shim completes the magnetic circuit. If the steel shim is too thin relative to the size of the magnetic field it channels, it may saturate, and part of the magnetic field may travel through the air instead. If magnetic flux travels through the air, it may decrease the magnitude and homogeneity of the field in the cylindrical sample space. Simulations predicted a 0.72 T bias magnetic field and a spatial homogeneity of 50 ppm in a 4 mm cube at the center of the bore, defining a cylindrical sample space.

To assemble the shim-a-ring, a series of acrylic discs were bolted to the top of the permanent magnet. The steel shim was made from a solid rod of steel. The steel shim was slipped over the discs, which thus aligned the permanent magnet and the steel shim while maintaining a separation between the two pieces such that the attractive forces between them were moderate. The steel shim fitted over the acrylic discs was released and energetically pulled into place around the permanent magnet. This assembly procedure allows careful management of the magnetic forces.

The completed shim-a-ring assembly with the commercially available permanent magnet has a mass of 3.16 kg. The measured bias magnetic field in the bore was 0.60 T. The bias magnetic field was measured with the Hall effect sensor along three orthogonal axes within the bore, where the origin was at the geometric center of the assembly. These axis measurements showed that the spatial homogeneity of the bias magnetic field, measured in ppm variation, was two orders of magnitude larger than the predicted spatial inhomogeneity modelled with COMSOL simulations. In this single-magnet assembly, the degradation can be attributed to the imperfections of the magnetization strength or direction within the permanent magnet.

The second shim-a-ring permanent magnet assembly used a custom permanent magnet and a commercially available steel shim. This permanent magnet assembly used an N55 NdFeB magnet.

The second shim-a-ring permanent magnet assembly example used a commercially available steel shim. COMSOL simulations showed that a low carbon steel tube with 38.1 mm outer diameter and 19.05 mm inner diameter had sufficient wall thickness to return the magnetic flux of an inset permanent magnet without saturating the steel shim's magnetization. To create the steel shim, the steel tube was cut to length and a flexible cylinder hone was used to smooth the inner surface.

The outer diameter of the custom permanent magnet was set to match the inner diameter of the steel shim because simulations showed best results for zero gap between the pieces. The outer diameter of the custom permanent magnet was about 0.05 mm smaller than the inner diameter of the steel shim in order to avoid binding between the two components. The bore size and total length were varied in COMSOL simulations to increase the strength of the bias magnetic field and spatial homogeneity. The allowed dimensions were limited by manufacturing capabilities. Although these capabilities varied between manufacturers, in general creating a ring magnet longer than 60 mm was not feasible. In addition, COMSOL simulations suggest that that ring magnets longer than 60 mm do not giver better performance. Similarly, a bore size of 10 mm or larger was preferred in order to accommodate the probe and allow enough space to add field-correcting shims.

Models were created for N55 grade neodymium iron boron magnets with a residual flux density of 1.48 T. Enlarging the size of the bore relative to the magnet outer diameter caused a decrease in magnetic field strength. Therefore, the nominal desired bore size was selected to be 10 mm. A 0.53 T field was predicted with COMSOL simulations for a 10 mm bore.

The shape of the steel shim may be selected to decrease the mass of the permanent magnet assembly without diminishing the homogeneity of the bias magnetic field in the cylindrical sample space. COMSOL simulations of a shim-a-ring permanent magnet assembly depict the flux density of the bias magnetic field through the steel shim.

Figure 4B:
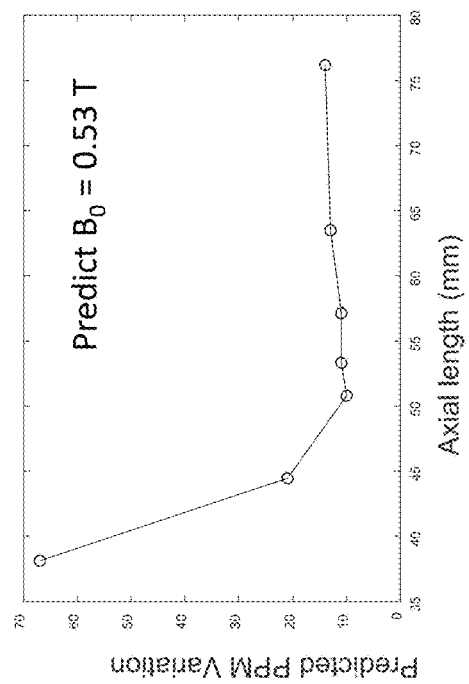
FIG. 4B is a plot of predicted magnetic homogeneity within a cylindrical sample space within a permanent magnet versus permanent magnet axial length.
Figure 4A:
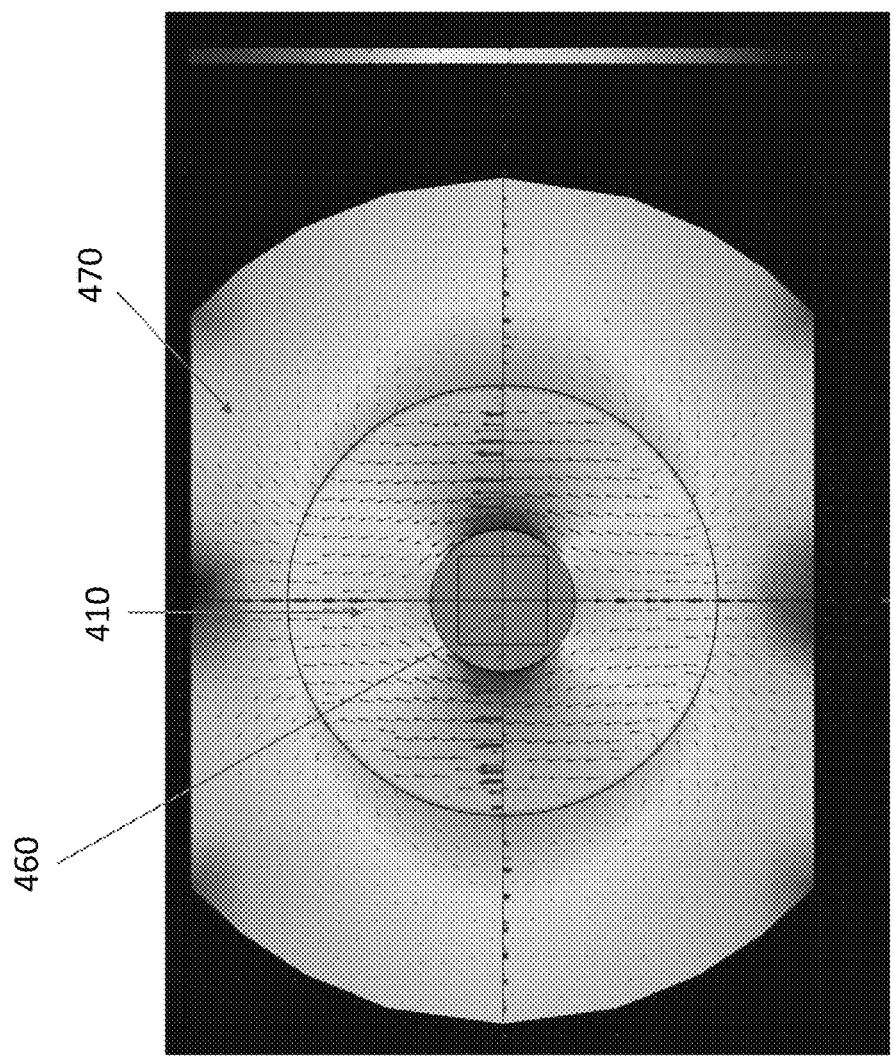
FIG. 4A is a simulation of the flux density of a magnetic field through a permanent magnet assembly.

FIG. 4A shows a COMSOL simulation cross-section through the geometric center of a permanent magnet assembly. The color map shows flux density of the magnetic field ranging from zero to 1.9 T. The arrows show the magnitude and direction of the flux density at that location. Removing sections of the cylindrical steel shim 470 in regions with less flux density may decrease the mass of the assembly while maintaining or improving the homogeneity in the cylindrical sample space 460. Up to about 15% of the steel shim 470 may be removed. The shape of the steel shim may be altered by removing flat or curved sections of the cylinder in a symmetric pattern next to the permanent magnet poles.

The amount of material to be removed from the cylinder may be selected using simulations. Simulations of a range of cutting depths can be compared to the resulting spatial homogeneity of the bias magnetic field. In simulations where flat or curved sections of the cylindrical steel shim were removed, the spatial homogeneity may increase by 20% to 40%. For example, simulations indicated that removing parallel flat sections of the steel shim 470 to create the semi-cylindrical shape shown in FIG. 4B may improve spatial homogeneity by 20% from 15 ppm to 12 ppm. The simulation example used a permanent magnet 410 with a 6 mm inner diameter, 19 mm outer diameter, and a 57 mm length. Material may also be removed to produce a more complex shape that more precisely removes regions of the steel shim corresponding with areas of lower flux density. For example, regions of the steel shim with a flux density of less than 0.4 T may be removed to produce a complex steel shim shape.

FIG. 4B shows a COMSOL simulation of spatial inhomogeneity of the magnetic field strength within a cylindrical sample space as the axial length of the permanent magnet assembly was varied. The simulation used a cylindrical steel shim. The magnetic field strength was sampled at evenly distributed points in a 4 mm cube within a cylindrical sample space that approximates the volume of a standard NMR sample tube. The permanent magnet inner diameter was fixed at 10 mm, the permanent magnet outer diameter was fixed at 19.05 mm, and the steel shim outer diameter was fixed at 38.1 mm. The axial length was varied between 40 mm and 75 mm. The simulations show homogeneity increased rapidly as the axial length increases, and then levelled off or slowly increased as the axial length increased beyond about 50 mm. Similarly, simulations indicate greater homogeneity at a permanent magnet inner diameter of 10 mm for an outer diameter of 19.05 mm and an axial length of 50.8 mm. The axial length of the permanent magnet assembly that creates a greater homogeneity in the cylindrical sample space is between about 40 mm and 60 mm. The axial length of the permanent magnet for a given permanent magnet assembly will depend on the type and geometry of the permanent magnet assembly. In each of these simulations, the spatial inhomogeneity reached a minimum of about 10 ppm.

Additional simulations were performed for larger and smaller inner diameters, and longer and shorter axial lengths of the permanent magnet. In each case, a geometry existed with a spatial homogeneity of 10 ppm. Based on these results, custom magnets were made (SM Magnetics, AL) according to the specifications summarized in Table 2.

TABLE 2

Custom shim-a-ring magnet specifications

| Parameter | Value |
| --- | --- |
| Magnet Grade | N55 NdFeB |
| Magnet Inner Diameter | 10 mm |
| Magnet Outer Diameter | 19.05 mm |
| Steel Shim Inner Diameter | 19.05 mm |
| Steel Shim Outer Diameter | 38.1 mm |

The custom shim-a-ring is smaller than the shim-a-ring constructed using a commercially available permanent magnet. The custom shim-a-ring permanent magnet assembly had a mass of 418 g.

Spatial homogeneity of the custom shim-a-ring was measured with the Hall effect sensor. The spatial homogeneity, while still orders of magnitude larger than the predicted value, was improved over the shim-a-ring using a commercially available permanent magnet. The magnitude of the bias magnetic field was 0.48 T.

The spatial homogeneity of the bias magnetic field in the shim-a-ring assembly with a custom permanent magnet was able to measure NMR signals. NMR signals were measured for samples of 5 mM manganese chloride solution using a 2.5 mm outer diameter sample tube and a 1.7 mm outer diameter sample tube without any additionally shimming. The signals were measured on an oscilloscope immediately after the preamp 282 without mixing down the frequency. The field variation was computed to be 1100 ppm in the 2.5 mm sample tube and 500 ppm in the 1.7 mm sample tube. The smaller sample tube had less signal amplitude and better homogeneity because it spatially samples a smaller volume of the magnetic field.

Spatial Inhomogeneity Compensation with Active Shimming

Shimming is a process used to decrease spatial inhomogeneities in the bias magnetic field applied by the permanent magnet. In order to measure NMR signals, shimming is particularly beneficial in the cylindrical sample space. Common pulse NMR systems often use passive shims, which are small permanent magnets.

These passive shims take laborious calibration and are limited by the mechanical precision with which they can be aligned with respect to the bias magnetic field. Micron-level displacements of the passive shims can cause large modifications of the bias magnetic field. Calibrating the passive shims is laborious and iterative. First, a map is made of the magnetic field, either using MRI to take a picture, or point by point with a small Hall sensor or NMR probe. Next, the measured field is decomposed into spherical harmonic components. The shim magnet displacements that null these components are computed, then effected. Finally, the magnetic field is mapped again, and the process is repeated until the desired homogeneity is obtained. In a portable system, passive shims may slip out of alignment as the system is carried about, thereby using frequent recalibration. Although effective, passive shims are not practical for miniature NMR systems intended for simple and inexpensive fabrication, wide implementation, or portability.

Active shims are electromagnets that continuously consume electrical power to compensate spatial inhomogeneity. The active shim is electrically connected to a voltage source that supplies a current to the active shim. Instead of using micron-level mechanical displacements to control passive shims, active shims use current polarity and amplitude to control the level of magnetic field compensation. Correction of the bias magnetic field scales with the strength and direction of the current supplied. In conventional NMR systems, the bias fields are too strong for their inhomogeneities to be corrected efficiently with only active shims. In a stochastic NMR system, however, the bias fields are small enough for their inhomogeneities to be compensated with efficient (low-current) active shims instead of with passive shims.

An active shim system may provide numerous benefits when used in a miniature stochastic NMR system. Rather than using moveable magnets whose positioning corrects a specific magnetic field, an identical shim coil could be installed in every unit. Instead of arduous micron-level mechanical displacements the level of field correction could be easily controlled by the current polarity and amplitude. Finally, mapping the field would not be necessary. Instead, a calibration routine could find a current for each shim by measuring the NMR signal and searching for the longest duration in the time domain, or the narrowest peak in the frequency domain.

One limitation for using an active shim in an NMR system is the amount of electrical power that can be run through it to correct spatial inhomogeneity. Heat generated due to ohmic resistance in the active shim is limited in order to avoid damage to the system. In common pulse NMR systems, the limited current density precludes active shims from being used as the primary shims. If the active shims were operated at a sufficiently high current density to shim a common pulse NMR system, the shims would generate enough heat to cause permanent damage to the system. In contrast, active shims may be used in a miniature stochastic NMR system because the system uses shorter measurement times. The current density in the active shim may be as high as $1 \times 10^8$ A/m$^2$ to correct the bias magnetic field in the stochastic NMR system. This current density is too high for continuous current operation due to the large amount of heat generated through Ohmic heating. However, this high current density may be acceptable for the short (e.g., 10-400 ms) experiment times used in stochastic NMR. The short duration of experiments in stochastic NMR limits Ohmic heating in the active shim. Running an active shim can correct 10-100 ppm of spatial inhomogeneity using a current density of $10^7$ A/m$^2$. For context, 100 ppm is 0.01% of the total bias magnetic field strength.

An active shim 220 compensates spatial inhomogeneity in the bias magnetic field produced by a permanent magnet in the stochastic NMR system. FIG. 5 shows a version of the active shim in the stochastic NMR system is a flexible conductor disposed along a surface of the cylindrical sample space 560 within the inner diameter of the permanent magnet 510 and the steel shim 570. The active shim is connected to a tunable voltage source 590 via electrical connections 580. The active shim compensates a spatial inhomogeneity within a portion of the cylindrical sample space where a sample is positioned for measurement. The active shim will occupy space between the permanent magnet and the sample. The magnetic field generated by the active shim will superpose with the bias magnetic field from the permanent magnet. The combined magnetic field will be more homogeneous than the bias magnetic field generated by the permanent magnet alone, and the active shim may correct for natural variations in the permanent magnet's bias magnetic field.

The system is intended to accommodate a standard NMR sample tube. Therefore, the active shim may compensate a spatial inhomogeneity within a spherical volume, which is approximately the size of the inner diameter of a standard NMR tube. The inner diameter of a standard NMR tube can be 3, 4 or 5 mm in diameter. Smaller NMR tubes may also be used if desired, with a minimum tube diameter of 300 μm.

The active shim may comprise traces with shapes that generate a magnetic field when conducting a current. The active shim is connected to a tunable voltage source 590, as shown in FIG. 5. A current is applied to the active shim using the tunable voltage source 590 to generate a magnetic field. The shape, orientation, and amplitude of the magnetic field generated by the active shim are selected to compensate the spatial inhomogeneity in the bias magnetic field generated by the permanent magnet 510. The active shim may be designed to compensate the bias magnetic field of a particular geometry of permanent magnet. For example, the active shim may be designed to compensate the bias magnetic field of a shim-a-ring, Halbach, Aubert, or iron yoke permanent magnet.

Figure 6:
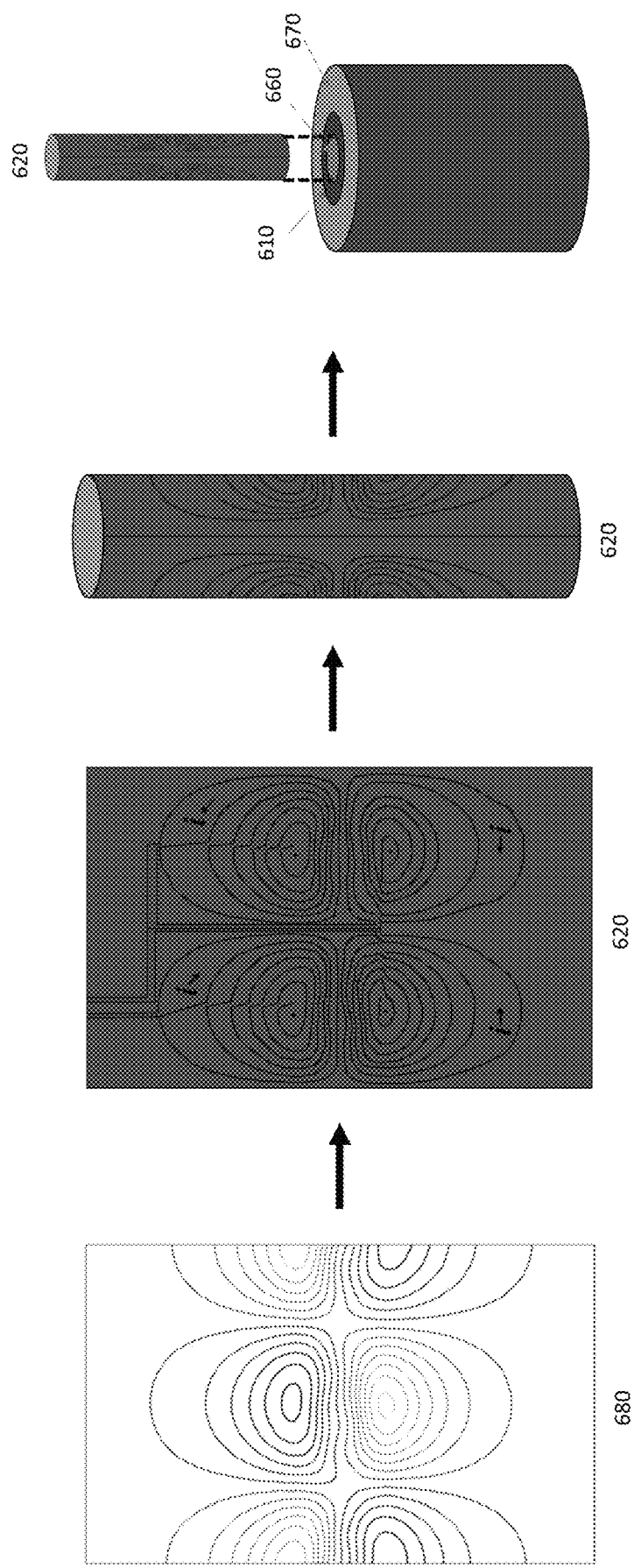
FIG. 6 is a schematic of an active shim modelled to correct a single spherical harmonic and its placement in a miniature stochastic NMR system in relation to the permanent magnet and cylindrical sample space.

FIG. 6 shows an active shim 620 for a stochastic NMR system. The active shim 620, was designed using a scalar stream function to calculate active shim currents, which compensate spherical harmonic spatial inhomogeneities in the bias magnetic field. The active shim 620 can be designed using a contour map 680 of the stream function calculated to compensate for a spherical harmonic coefficient. The active shim can compensate for a first, second, third or higher order spherical harmonic coefficient for a give permanent magnet assembly. To realize the active shim 620, metal traces based on the contour map 680 are connected to allow current flow. The active shim 620 is rolled into a cylindrical shape and placed into the stochastic NMR system so that it is disposed along the inner diameter of the permanent magnet 610. Optionally, the stochastic NMR system may additionally have a thermal insulator such as a thin sheet of polymer between the active shim and the permanent magnet to deter heat transfer from the active shim to the permanent magnet. The diameter of the active shim can be varied, with smaller diameters generating stronger magnetic fields but also diminishing the size of the cylindrical sample space 660. For example, the diameter of the active shim 620 can be about 6 mm to about 10 mm.

The active shim's traces may be on a flexible printed circuit board. The metal traces material may be made of copper, tin, lead, gold, silver, platinum, or an alloy of any of these metals. The flexible circuit board may include an insulating polymer, such as polyimide, polyester, polyether ether ketone or another flexible polymer. The thickness of the metal traces may be varied. Thicker metal traces will allow higher current flow but will reduce the size of the cylindrical sample space. The thickness of the metal traces can be, for example, 35 μm to 70 μm. The minimum width of the metal traces is 0.3 mm and each trace has at least 0.1 mm between it and an adjacent trace. The printed circuit board may have two layers of metal traces separated by an insulating layer and connected with one or more vias. The two layers of metal traces may reinforce one another and increase the strength of the generated magnetic field.

The magnetic field of the shim-a-ring permanent magnet assembly was measured in terms of an orthogonal basis set, the spherical harmonic expansion, to assess the level of inhomogeneity. A spherical polar coordinate system with the z-axis set to align with the magnetic field was used. Each spherical harmonic of order n has m degrees, where m ranges from −n to n. Harmonics of degree zero are called zonal harmonics, and harmonics of degree other than zero are called tesseral harmonics. The zonal and tesseral harmonics were isolated. To determine the order n of the tesseral harmonics, several rings of points with equivalent radii r' at various heights z were measured. These measurements approximate the surface of a cylinder. The field measurements allow calculation of the first, second, and some third order tesseral harmonics, and the first through fourth order zonal harmonics.

In the shim-a-ring assembly, the bias magnetic field is perpendicular to the bore. The z-axis was chosen to align with the bias magnetic field. The origin was set at the geometric center of the permanent magnet. The Hall Effect sensor with custom PCB was used to map the field. The field mapping procedure used 7 points along the z-axis, and three rings of eight points each at different z. Measurements along the z-axis were spaced every 1 mm from z=−3 mm to z=3 mm. The three circles had a radius of 2 mm and were located at z=−2 mm, z=0 mm, and z=2 mm. A discrete Fourier transform of the eight points around each circle yielded the first and second degree harmonic components: $a_i \cos \varphi$, $b_i \sin \varphi$, $c_i \cos 2\varphi$, and $d_i \sin 2\varphi$, where i is the index denoting the coefficients derived from circles 1, 2 and 3. The coefficient for each degree contained contributions from every order which had a harmonic of each degree. For example, the first degree cos $\varphi$ term contained contributions from the first, second, third and higher orders. The second degree cos 2$\varphi$ term contained contributions from the second, third and higher orders, but not from the first order, because the first order harmonic has no second degree.

In cylindrical coordinates, the first degree cos $\varphi$ component of the field is given by, $$B(z, \rho) = \left[S(X)\rho + 3S(ZX)z\rho + S(Z^2X)\left[6z^2\rho - \frac{3}{2}\rho^3\right] + \ldots\right]\cos\varphi$$

where S(X) is the amplitude of the X shim, S(ZX) the amplitude of the ZX shim, and S(Z$^2$X) the amplitude of the Z$^2$X shim. In the equation above, the first term is the field contribution from the first order, the second term from the second order, and so on. To extract the contributions of each order, measured data was fit to the polynomial. Because there were three measured values for $a_i$, it was possible to include coefficients from the first three orders in the polynomial fit, where the coefficients of the polynomial were exactly determined. In the same way, the S(Y), S(ZY) and S(Z2Y) amplitudes were computed from the sin $\varphi$ contributions to the field and the three values of $b_i$.

The cos 2$\varphi$ component of the field in cylindrical coordinates is given by, $$B(z,\rho)=[3S(X^2-Y^2)\rho^2+15S(Z(X^2-Y^2))z\rho^2+\ldots] \cos 2\varphi$$

A least squares fit was used to determine the second- and third-order coefficients using the three values of $c_i$. The same procedure was used to compute the S(2XY) and S(Z(2XY)) amplitudes using the three values of $d_i$.

For the zonal harmonics, the field generated by the zeroth through first orders is, $$B(z, \rho) = S(Z^0) + S(Z^1)z + S(Z^2)\left[z^2 - \frac{1}{2}\rho^2\right] + S(Z^3)\left[z^3 - \frac{3}{2}\rho^2 z\right] + S(Z^4)\left[z^4 - 3z^2\rho^2 + \frac{3}{8}\rho^4\right]$$

The shim coefficients were again computed with a least squares fit, this time using all 31 data points. The largest coefficients computed were for the zonal harmonics, corresponding to significant variations in the direction of the field. Active shims were designed to correct for the measured spherical harmonics. Currents used to compensate for each of the spherical harmonic coefficients were calculated using a stream function. The stream function was computed by summing the effects of 4,500 discrete points and approximated to be constant in the area surrounding each point. The magnetic field to be generated by an active shim was computed by summing the effects of the 4,500 discrete points used to calculate the stream function.

The stochastic NMR system may alternatively have an array of active shims 720, as shown in FIG. 7. Each active shim within the array 720 may compensate for a single spherical harmonic coefficient spatial inhomogeneity. The spherical harmonic coefficients contain contributions from the first, second and third-order spherical harmonics. The array 720 may contain up to 14 active shims. Within the stochastic NMR system, the array 720 may be nested so that layers of active shims 720 are placed along the inner diameter of the permanent magnet 710. Active shims 720 in the array may be arranged with respect to their radii to increase overall power efficiency. The efficiency of each active shim depends primarily on which spherical harmonic coefficient the active shim is correcting. With an arrangement of active shims based on their efficiency, the overall power consumption of the array of active shims during a typical NMR measurement can be reduced from 50 W to 5 W. According to the Biot-Savart law, the magnetic field generated by a current source scales inversely with the distance squared. Therefore, active shims with lower power efficiency may be placed closer to the cylindrical sample space 760.

Active shims that compensate higher order harmonics may use more power to achieve the same ppm correction. The magnitude of each harmonic order n scales as $(r/r_0)^n$, where r starts at the center of the cylindrical sample region and $r_0$ is the maximum radius where the analysis is valid, namely the radius of the largest sphere that contains no magnetic sources. Thus, the level of compensation used to correct the bias magnetic field diminishes with higher orders, helping to balance the decreasing shim efficiencies.

Stochastic NMR Data Collection and Processing

Figure 8:
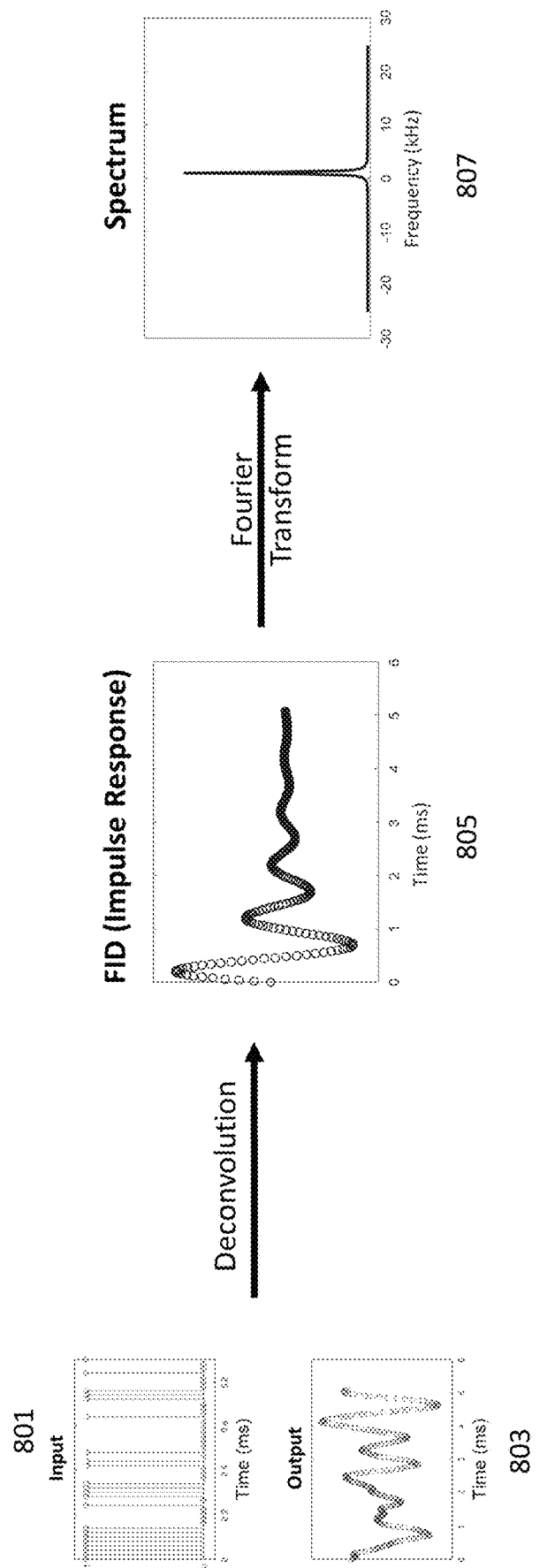
FIG. 8 shows a method of collecting and processing data from a stochastic NMR system to generate an NMR spectrum.

In stochastic NMR, a sample is excited using a stochastically pulsed rf magnetic field. The pulses are stochastically modulated in amplitude, phase, duration, frequency, or some combination thereof. System identification techniques are used to calculate the impulse response of the sample. FIG. 8 shows a method of collecting and processing data from a stochastic NMR system to generate an NMR spectrum. Stochastic excitation pulses 801 are generated by the transmitter pathway 260 in the stochastic NMR system 200. The detector 240 detects the NMR signal from the sample and the receiver pathway 280 amplifies and records the signal output 803 as an impulse response. The FID 805 is obtained from the impulse response by deconvolving the input 801 and output 803 signals. The amplitude of the FID 805 signal can be correlated with a sample's nuclear spin density. Alternatively, the FID can undergo Fourier transform to give an NMR spectrum.

During a stochastic NMR experiment, after the electronics send an excitation pulse, they take time to recover before they can detect the much weaker impulse response from the sample. This time to recovery is called the "dead time." Because the impulse response decays more quickly in an inhomogeneous magnetic field, it can be difficult or impossible to record the NMR signal after a pulse if the dead time is too long and the magnetic field variation is too high. Even in a homogeneous field, the dead time can cause the receiver to miss the beginning of the FID. Because the pulses are less powerful in stochastic NMR, the dead time is shorter. Thus, this technique can recreate the FID with a shorter dead time than conventional pulsed NMR techniques. Furthermore, the stochastic technique can measure a signal in an inhomogeneous field that would have decayed too quickly to be measured using pulse NMR methods.

The stochastic NMR system may be used to collect 1D stochastic or Fourier transform NMR. For either type of measurement, experiment time is limited to 10 ms to 400 ms because of the Ohmic heating limits of the active shims. For a 1D stochastic NMR measurement, the stochastic NMR system may operate with a duty cycle of about 25% to about 50%, a pulse amplitude of 1 $V_{pp}$ to 4 $V_{pp}$, and a pulse repetition frequency of about 2 kHz to about 100 kHz. For a 1D Fourier transform NMR measurement, the system may operate with a pulse amplitude of 10 $V_{pp}$ to 80 $V_{pp}$. With Fourier transform NMR, FID may be sampled after each pulse and the sample may relax before another measurement is conducted. The time between measurements should be three times longer than the spin-lattice relaxation time for the sample. The active shims may be turned off during part of this relaxation time to reduce Ohmic heating. A spin echo technique may be used to determine spin-lattice and spin-spin relaxation times for samples measured with 1D Fourier transform NMR.

The stochastic NMR system may also be used to collect stochastic multidimensional NMR spectra. In this scenario, a sample may be excited using a pseudorandom white noise sequence, and a nonlinear cross-correlation allows computation of multi-dimensional spectra. While common pulse NMR techniques painstakingly measure one at a time the varying delays between pulses employed in 2D or 3D experiments, stochastic NMR gathers all the information in a single experiment that lasts no longer than a simple 1D measurement. In stochastic NMR, one can gather all the data for the 2D experiment in a single run, because the stochastic input already contains all the time delays within the sequence. Unlike common pulse NMR, the stochastic NMR system does not need to reset and repeat experiments in order to collect multidimensional data.

The stochastic NMR system may be automated to simplify operation for the user or decrease the system's downtime. Prior to automation, the system should be calibrated for a particular type of sample. The user may calibrate the system using a calibration sample. To calibrate, the user may test sample excitation at a range of pulse frequencies, amplitudes, and experiment lengths to determine the conditions at which the sample gives a strong NMR signal. Once the system is calibrated, the user may conduct multiple tests on similar samples. The NMR system may use automatic shimming. With each active shim controlling an orthogonal harmonic, each active shim may be tuned individually. An automatic active shim calibration routine may include tuning the current amplitude and direction in the active shim while measuring the NMR signal and selecting those conditions that produce a long duration signal in the time domain or a narrower peak in the frequency domain. Post-processing may be automatic, and relevant parameters may be extracted and displayed to the user. This type of testing may be applicable in a number of applications including quality control testing.

Experimental Results of Spin Density Measurements

With stochastic NMR, the amplitude, phase, duration or frequency of the pulses can be modulated. Pulses may be sent with two different phases. The sampling frequency and pulse width is determined by the system bandwidth. Because the frequency is mixed down, it is not necessary to sample as fast as the Larmor frequency. The signal is shifted to low frequencies, and sampling should be fast enough to capture the range of frequencies present in the spectrum, or the range of frequencies due to an inhomogeneous magnetic field. In either case, the sampling frequencies should be at least twice the system bandwidth in order to avoid aliasing. Likewise, the pulses should be short enough to excite the entire system bandwidth.

In the stochastic NMR system, the excitation sequence may be preprogrammed, and the user may simply press play. The excitation power may be adjusted to different samples. The appropriate excitation power depends on the relaxation time of the sample but can be found heuristically by testing different excitation levels. Overall, stochastic excitation holds great promise in the context of miniature NMR, as a low power technique with simple experiments and the potential for automated data processing.

The NMR spectrum carries powerful, detailed information about a sample. However, in an inhomogeneous magnetic field, spectra can be obscured due to inhomogeneous broadening. Techniques have been developed in common pulse NMR to recover some information: the pulse-echo experiment can be used to find relaxation times in the presence of field inhomogeneity. Comparable techniques have not been demonstrated using stochastic excitation, though finding relaxation times from a three-dimensional measurement in an inhomogeneous field is possible. Using a linear analysis, the FID found through correlation techniques should match what is observed after a 90° pulse: the total signal amplitude rapidly decays due to interference between the nuclei of different resonant frequencies.

In a sufficiently inhomogeneous field where an NMR spectrum cannot be easily collected, data can still be collected for the initial amplitude of the NMR signal. The initial amplitude is proportional to the number of nuclei present. The measured NMR signal is the sum of the contributions from all the individual nuclei. Thus, the total signal amplitude scales directly with the number of resonant nuclei in the sample. After an excitation pulse, the magnetization of the nuclei is initially aligned, even in an inhomogeneous field. Then as the spins precess at different frequencies, they become more and more out of phase. Assessing the quantity of resonant nuclei by looking at the initial FID amplitude is called a spin density measurement.

Spin density measurements can be performed with either stochastic or common pulse NMR methods, but there is an advantage to the stochastic technique: the reduction of dead time. Dead time refers to how much time passes before the receiver can start recording the NMR signal after an excitation pulse. The detector 240 and receiver pathway 280 are extremely sensitive in order to detect the tiny NMR signal, and they saturate during the excitation, even though the pulses are attenuated by the transmit/receive switch 270. The speed with which the receiver recovers from saturation is the dead time. Because the excitation pulses are much smaller in stochastic NMR than in common pulse NMR, the dead time is reduced, and the initial signal amplitude can be recorded with more accuracy because there has been less time to dephase.

To verify the stochastic NMR system experimentally, samples containing different ratios of water and heavy water were tested with a stochastic NMR system like the one shown in FIGS. 2A and 2B. The system excited samples at the $^1H$ resonant frequency of around 20.5 MHz. The protons in the water produced an NMR signal, while the nuclei of the heavy water remained silent. The amplitude of the impulse response can be used to compare the known ratio of protium and deuterium in the sample, thus verifying that spin density was accurately measured.

Figure 9:
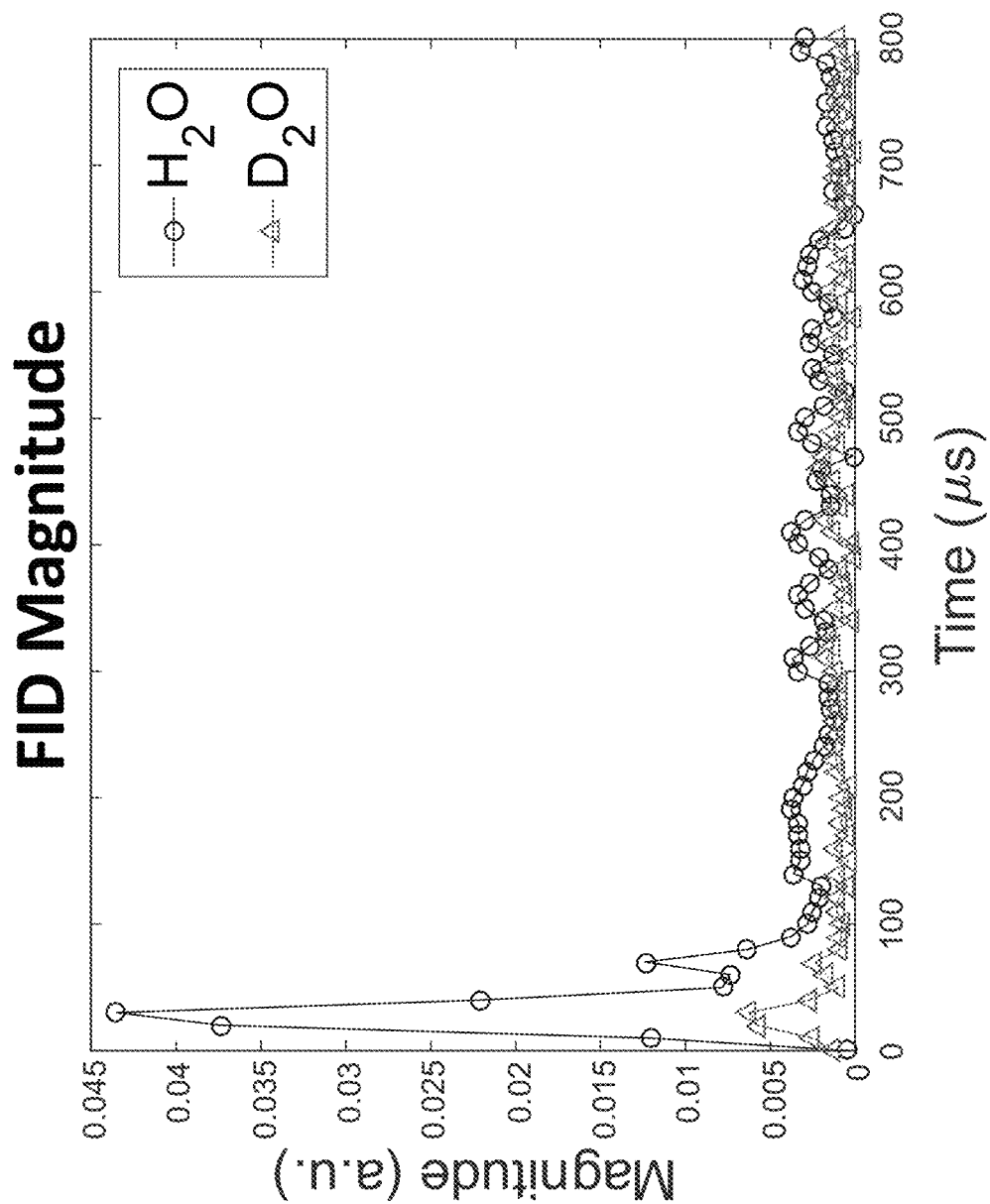
FIG. 9 is a plot of the impulse response for water and heavy water measured with a stochastic NMR system using 100 kHz sampling.
Figures 10A, 10B:
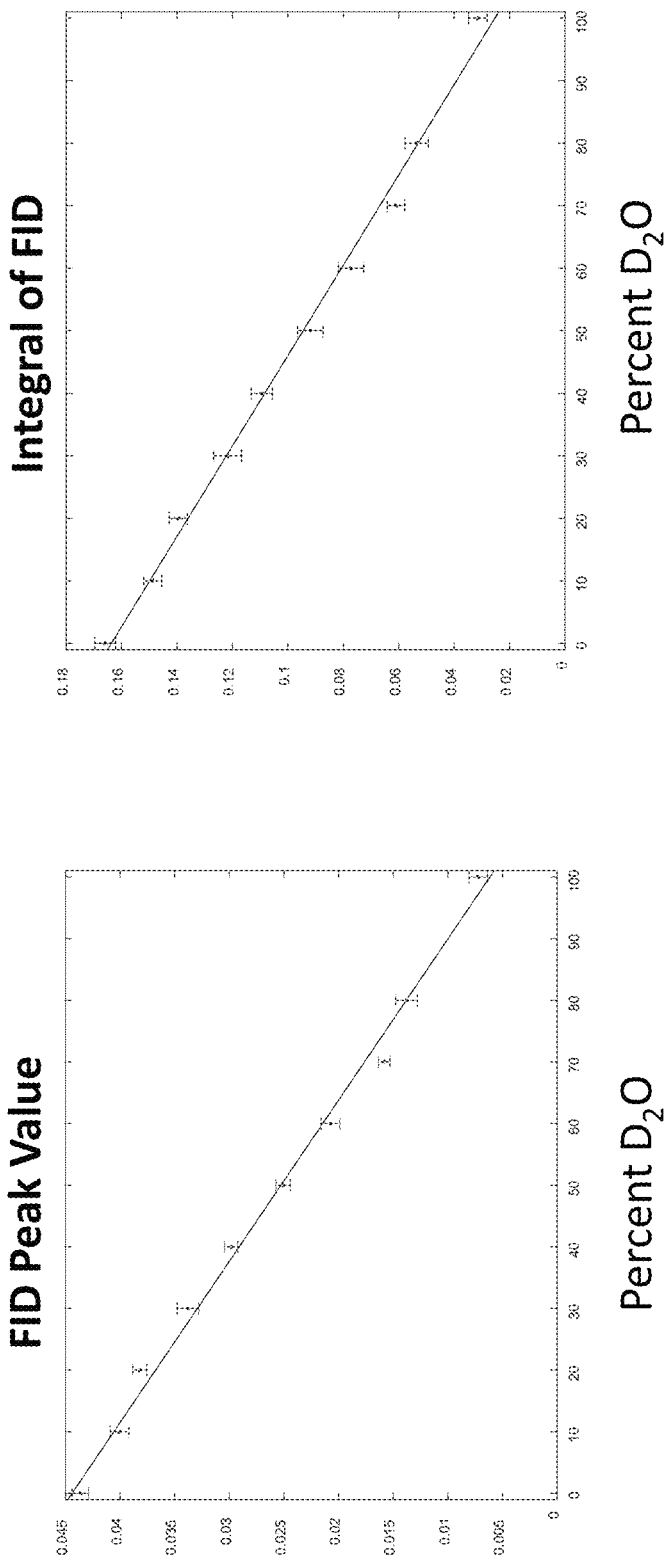
FIGS. 10A and 10B show plots of the impulse response as it varies linearly with the ratio of heavy water in a sample measured with a stochastic NMR system using 100 kHz sampling.

FIG. 9 shows the magnitude of the impulse responses measured for water and heavy water. Both samples were doped with paramagnetic salt, 5 mM manganese chloride, to speed up relaxation. The stochastic NMR system sent pulses and measured magnetization at a rate of 100 kHz. The duty cycle was 25%, meaning that each excitation pulse was 2.5 μs long. The output of the preamplifier and the local oscillator were both disconnected from the mixer for 3 μs after each pulse to allow noise from the transmit/receive switch to attenuate. The receiver system 280 sampled magnetization at the end of each 10 μs cycle. The rf pulses were sent at the resonant frequency of 20.49 MHz. The volume of the excited sample was approximately 10 μL. This experiment was repeated with ten samples with each sample containing a known ratio of protium and deuterium. FIGS. 10A and 10B shows the results from these experiments. FIG. 10A shows the peak value of the impulse response as it varied linearly with the ratio of protium and deuterium. FIG. 10B shows the results when the impulse response in each experiment was integrated.

Applications for which stochastic NMR system spin density measurements might prove useful include identifying contaminants, verifying supply chain authenticity, and screening raw materials. Additional applications include measuring oil content in food, seeds, and wastewater; hydrogen content in fuel; and fluorine content in toothpaste, industrial waste, and raw materials. Quantitative measurements may be made using one or more calibration samples with a known content.

Figure 11B:
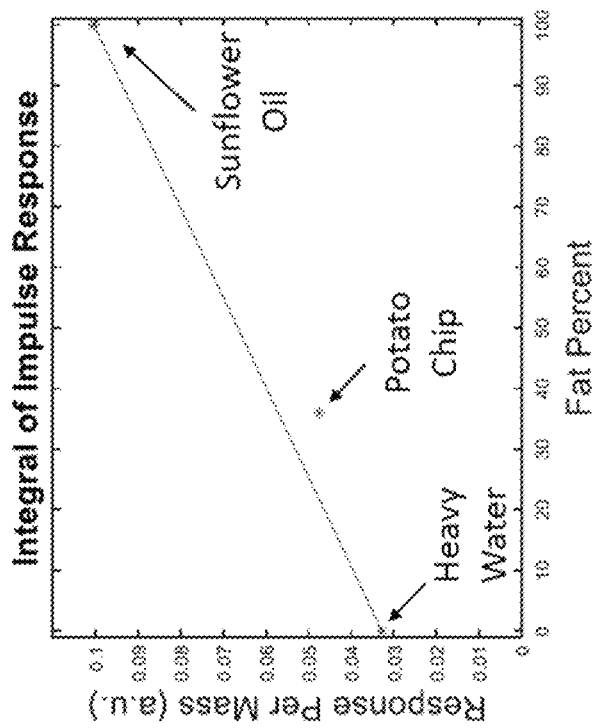
FIGS. 11A and 11B show plots of the impulse response of samples of heavy water, potato chip and sunflower oil measured with a stochastic NMR system.
Figure 11A:
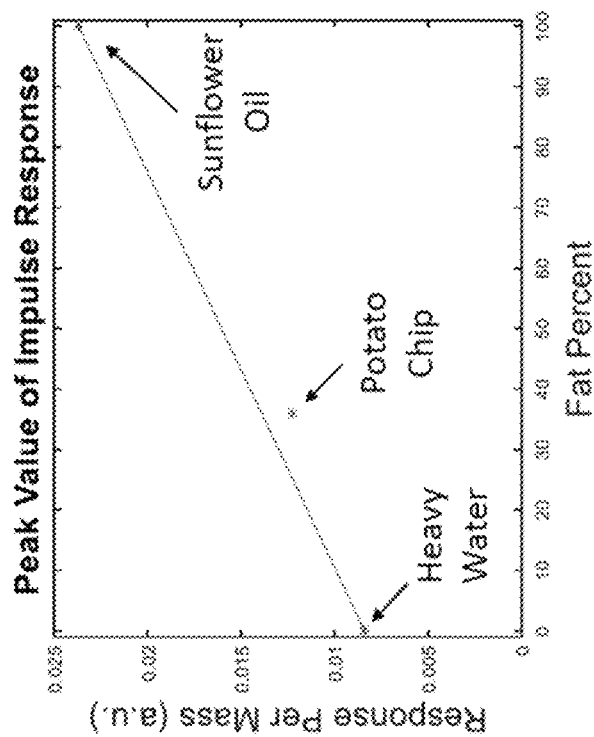

FIGS. 11A and 11B illustrate an example application where spin density measurements may be useful. FIGS. 11A and 11B show how the stochastic NMR system can be used to measure the oil content in a potato chip sample. The experiment used calibration with heavy water and sunflower seed oil samples. FIG. 11A shows the peak value of the impulse response for the three samples and FIG. 11B shows the integral of the impulse response for the three samples. The impulse response of the potato chip sample can be calibrated with the impulse responses the sunflower seed oil and heavy water in order to quantify the oil content in the potato chip sample.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize or be able to ascertain, using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of" "only one of" or "exactly one of." "Consisting essentially of" when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A stochastic nuclear magnetic resonance (NMR) system comprising:
   a permanent magnet to apply a bias magnetic field to a sample;
   an active shim to compensate a spatial inhomogeneity in the bias magnetic field applied to the sample by the permanent magnet;
   an electromagnet to apply a stochastically pulsed radio-frequency magnetic field to the sample;
   a detector to sense responses from the sample to the stochastically pulsed radio-frequency magnetic field; and
   a processor, operably coupled to the detector, to determine a spin density of the sample based on the responses from the sample,
   wherein the permanent magnet defines a cylindrical sample space and the active shim comprises a flexible conductor disposed along a surface of the cylindrical sample space.

2. The stochastic NMR system of claim 1, wherein the stochastic NMR system does not comprise any passive shim for compensating the spatial inhomogeneity in the bias magnetic field.

3. The stochastic NMR system of claim 1, wherein the stochastic NMR system weighs less than 1 kilogram.

4. The stochastic NMR system of claim 1, wherein the cylindrical sample space has a diameter of about 6 mm to about 10 mm.

5. The stochastic NMR system of claim 1, wherein the permanent magnet has an axial length of about 40 mm to about 60 mm.

6. The stochastic NMR system of claim 1, wherein the permanent magnet has an axial length selected to decrease the spatial inhomogeneity in the bias magnetic field in the cylindrical sample space.

7. The stochastic NMR system of claim 1, wherein the sample is in a sample volume with an inner diameter of about 3 mm to about 5 mm and the detector senses responses from the sample volume.

8. The stochastic NMR system of claim 1, wherein the bias magnetic field has a field strength of about 0.48 T to about 2 T.

9. The stochastic NMR system of claim 1, wherein the active shim is configured to compensate for a second-order spherical harmonic spatial inhomogeneity in the bias magnetic field.

10. The stochastic NMR system of claim 1, wherein the active shim is configured to compensate for a third-order spherical harmonic spatial inhomogeneity in the bias magnetic field.

11. The stochastic NMR system of claim 1, where the active shim is in an array of active shims.

12. The stochastic NMR system of claim 11, wherein the array of active shims is spatially arranged to limit power consumption of the active shims to less than 5 W.

13. The stochastic NMR system of claim 11, wherein the array of active shims is arranged so that active shims with lower power efficiency relative to other active shims in the array of active shims are closer to the sample.

14. The stochastic NMR system of claim 1, wherein the active shim is configured to compensate the spatial inhomogeneity in the bias magnetic field by applying a magnetic field to the sample while the electromagnet applies the stochastically pulsed radio-frequency magnetic field to the sample.

15. The stochastic NMR system of claim 1, wherein the stochastically pulsed radio-frequency magnetic field has a duration of about 10 ms to about 400 ms, a duty cycle of about 25% to about 50%, a pulse amplitude of about 1 $V_{pp}$ to about 4 $V_{pp}$, and a pulse repetition frequency of about 2 kHz to about 100 kHz.

16. The stochastic NMR system of claim 1, wherein the detector is configured to measure an amplitude of the response about 3 μs after each pulse in the stochastically pulsed radio-frequency magnetic field.

17. The stochastic NMR system of claim 1, wherein the stochastic NMR system is configured to measure the spin density of at least one of $^1H$, $^{13}C$, $^{19}F$, $^{17}O$, $^{11}B$, or $^{31}P$.

18. The stochastic NMR system of claim 17, wherein the spin density is used to measure at least one of a concentration of hydrogen in fuel, a concentration of oil in food, or a concentration of fluorine in toothpaste.

19. The stochastic NMR system of claim 1, wherein the processor is configured to determine an NMR spectrum of the sample based on the responses from the sample.

20. The stochastic NMR system of claim 19, wherein the stochastic NMR system is configured to perform multi-dimensional NMR spectroscopy.

21. A stochastic nuclear magnetic resonance (NMR) system comprising:
   a permanent magnet to apply a bias magnetic field to a sample;
   an active shim to compensate a spatial inhomogeneity in the bias magnetic field applied to the sample by the permanent magnet;
   an electromagnet to apply a stochastically pulsed radio-frequency magnetic field to the sample;
   a detector to sense responses from the sample to the stochastically pulsed radio-frequency magnetic field;
   a processor, operably coupled to the detector, to determine a spin density of the sample based on the responses from the sample; and
   a steel shim encasing the permanent magnet and having a size and a shape selected so that the steel shim superimposes with regions of flux density of the bias magnetic field that are higher than 0.4 T.

22. A stochastic nuclear magnetic resonance (NMR) system, comprising:

a permanent magnet to apply a bias magnetic field to a sample;

an active shim to compensate a spatial inhomogeneity in the bias magnetic field applied to the sample by the permanent magnet;

an electromagnet to apply a stochastically pulsed radio-frequency magnetic field to the sample;

a detector to sense responses from the sample to the stochastically pulsed radio-frequency magnetic field; and a processor, operably coupled to the detector, to determine a spin density of the sample based on the responses from the sample, wherein the active shim comprises a flexible printed circuit board having traces with shapes based on the spatial inhomogeneity in the bias magnetic field.

23. The stochastic NMR system of claim 22, wherein the flexible printed circuit board is comprised of two layers of traces separated by a layer of insulation and the two layers are electrically connected with a via.

24. The stochastic NMR system of claim 22, wherein the traces are comprised of metal and are about 70 μm wide.

25. A method comprising:

applying a bias magnetic field to a sample with a permanent magnet;

compensating a spatial inhomogeneity in the bias magnetic field with an active shim;

applying a stochastically pulsed radio-frequency magnetic field to the sample;

detecting responses from the sample to the stochastically pulsed radio-frequency magnetic field; and determining a spin density of the sample based on the responses from the sample, wherein compensating the spatial inhomogeneity comprises compensating for a third-order spherical harmonic spatial inhomogeneity in the bias magnetic field.

26. The method of claim 25, wherein the bias magnetic field has a field strength of about 0.48 T to about 2 T.

27. The method of claim 25, wherein compensating the spatial inhomogeneity comprises compensating for a second-order spherical harmonic spatial inhomogeneity in the bias magnetic field.

28. The method of claim 25, wherein the stochastically pulsed radio-frequency magnetic field has a duration of about 10 ms to about 400 ms, a duty cycle of about 25% to about 50%, a pulse amplitude of about 1 $V_{pp}$ to about 4 $V_{pp}$, and a pulse repetition frequency of about 2 kHz to about 100 kHz.

29. The method of claim 25, wherein determining the spin density of the sample comprises measuring an amplitude of the response about 3 μs after a trailing edge of each pulse in the stochastically pulsed radio-frequency magnetic field.

30. The method of claim 25, wherein the active shim is operated at a current density of up to about $10^8$ A/m².

* * * * *